US011056384B2

(12) United States Patent
Hsieh et al.

(10) Patent No.: US 11,056,384 B2
(45) Date of Patent: Jul. 6, 2021

(54) METHOD FOR FORMING CONTACT PLUG

(71) Applicant: TAIWAN SEMICONDUCTOR MANUFACTURING CO., LTD., Hsinchu (TW)

(72) Inventors: Wen-Jia Hsieh, Changhua County (TW); Long-Jie Hong, Hsinchu (TW); Chih-Lin Wang, Hsinchu County (TW); Kang-Min Kuo, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/678,666

(22) Filed: Nov. 8, 2019

(65) Prior Publication Data

US 2020/0075401 A1 Mar. 5, 2020

Related U.S. Application Data

(60) Continuation of application No. 15/888,999, filed on Feb. 5, 2018, now Pat. No. 10,475,699, which is a (Continued)

(51) Int. Cl.
*H01L 21/768* (2006.01)
*H01L 29/16* (2006.01)
(Continued)

(52) U.S. Cl.
CPC .. *H01L 21/76831* (2013.01); *H01L 21/02063* (2013.01); *H01L 21/28518* (2013.01);
(Continued)

(58) Field of Classification Search
CPC ............ H01L 23/485; H01L 23/53223; H01L 23/53238; H01L 23/53266;
(Continued)

(56) References Cited

U.S. PATENT DOCUMENTS 8,207,060 B2 6/2012 Yang
9,437,706 B2 9/2016 Mukherjee et al.
(Continued)

FOREIGN PATENT DOCUMENTS

CN 102239546 A 11/2011
JP H10242077 A 9/1998
KR 10-2010-0089902 A 8/2010

*Primary Examiner* — Matthew E Warren
(74) *Attorney, Agent, or Firm* — Maschoff Brennan

(57) ABSTRACT

The semiconductor device includes a substrate, an epi-layer, a first etch stop layer, an interlayer dielectric (ILD) layer, a second etch stop layer, a protective layer, a liner, a silicide cap and a contact plug. The substrate has a first portion and a second portion. The epi-layer is disposed in the first portion. The first etch stop layer is disposed on the second portion. The ILD layer is disposed on the first etch stop layer. The second etch stop layer is disposed on the ILD layer, in which the first etch stop layer, the ILD layer and the second etch stop layer form a sidewall surrounding the first portion. The protective layer is disposed on the sidewall. The liner is disposed on the protective layer. The silicide cap is disposed on the epi-layer. The contact plug is disposed on the silicide cap and surrounded by the liner.

20 Claims, 25 Drawing Sheets

Related U.S. Application Data division of application No. 14/477,689, filed on Sep. 4, 2014, now Pat. No. 9,887,129.

(51) Int. Cl.

| | |
|---|---|
| ***H01L 29/161*** | (2006.01) |
| ***H01L 29/45*** | (2006.01) |
| ***H01L 21/02*** | (2006.01) |
| ***H01L 21/285*** | (2006.01) |
| ***H01L 29/66*** | (2006.01) |
| ***H01L 29/78*** | (2006.01) |
| ***H01L 21/311*** | (2006.01) |
| ***H01L 23/485*** | (2006.01) |
| ***H01L 21/8238*** | (2006.01) |
| ***H01L 29/165*** | (2006.01) |
| ***H01L 23/532*** | (2006.01) |

(52) U.S. Cl.

CPC .. *H01L 21/31105* (2013.01); *H01L 21/76814* (2013.01); *H01L 21/823871* (2013.01); *H01L 23/485* (2013.01); *H01L 29/16* (2013.01); *H01L 29/161* (2013.01); *H01L 29/165* (2013.01); *H01L 29/45* (2013.01); *H01L 29/66568* (2013.01); *H01L 29/66636* (2013.01); *H01L 29/78* (2013.01); *H01L 29/7848* (2013.01); *H01L 21/76805* (2013.01); *H01L 21/76855* (2013.01); *H01L 23/53223* (2013.01); *H01L 23/53238* (2013.01); *H01L 23/53266* (2013.01); *H01L 2924/0002* (2013.01)

(58) Field of Classification Search

CPC ......... H01L 21/76829; H01L 21/76831; H01L 21/76832; H01L 21/76841; H01L 29/16; H01L 29/161; H01L 29/165; H01L 29/45; H01L 29/66568; H01L 29/66636; H01L 29/78; H01L 29/7848; H01L 21/02063; H01L 21/28518; H01L 21/31105; H01L 21/76814; H01L 21/823871

See application file for complete search history.

(56) References Cited

U.S. PATENT DOCUMENTS

| | | | | |
|---|---|---|---|---|
| 2004/0110392 | A1 | 6/2004 | Fu et al. | |
| 2009/0197404 | A1* | 8/2009 | Yang | H01L 21/76831 438/652 |
| 2009/0197494 | A1 | 8/2009 | Chang et al. | |
| 2012/0241868 | A1 | 9/2012 | Tsai et al. | |
| 2013/0049219 | A1* | 2/2013 | Tsai | H01L 21/28512 257/774 |
| 2013/0164895 | A1 | 6/2013 | Zeng et al. | |
| 2013/0234259 | A1* | 9/2013 | Yang | H01L 21/76831 257/401 |
| 2014/0131881 | A1 | 5/2014 | Wang et al. | |
| 2014/0361376 | A1 | 12/2014 | Lii | |
| 2015/0187896 | A1* | 7/2015 | Kamineni | H01L 29/41791 257/288 |
| 2015/0214319 | A1 | 7/2015 | Li et al. | |
| 2015/0380305 | A1* | 12/2015 | Basker | H01L 21/76846 257/77 |

* cited by examiner 310A
310B
310A
310B
310A
310B
310A
322
322
320
321
310
322D
322B
322A
322C
330

310A
310B
310A
310B
310A
310B
310A
370
360
353
322
350
351
352
340
321
310
320
322A
322B
322C
322D
330

370
360
310A
373
353
310B
322D
322B
322C
322A
330
320
350
352
340
321
310
351
322

METHOD FOR FORMING CONTACT PLUG

PRIORITY CLAIM AND CROSS-REFERENCE

This is a continuation application of U.S. patent application Ser. No. 15/888,999 filed on Feb. 5, 2018, now U.S. Pat. No. 10,475,699 issued on Nov. 12, 2019, which is incorporated herein by reference in its entirety. U.S. patent application Ser. No. 15/888,999 is a divisional application of U.S. patent application Ser. No. 14/477,689 filed on Sep. 4, 2014, now U.S. Pat. No. 9,887,129 issued on Feb. 6, 2018, which is incorporated herein by reference in its entirety.

BACKGROUND

As integration of elements in integrated circuits (IC) increases, line widths and geometries for semiconductor devices are reduced. Accordingly, resistance of a gate and a source/drain region of a MOS transistor made by conventional techniques are relatively high. In conventional techniques, an interlayer dielectric (ILD) layer and an etch stop layer are formed on a patterned substrate for isolation and over-etching. Then, the ILD layer and the etch stop layer are etched using an etchant to form an opening (surrounded by a sidewall of the ILD layer and the etch stop layer) for exposing a contact area such as the source/drain region, and a metal silicide layer can be formed on the contact area through the opening for reducing the resistance.

In the operation of forming the metal silicide layer, the opening is required to be cleaned first. In conventional techniques, a liner is formed conformal to the opening, and then a sputter etching operation (such as using an inert gas) and an SPM (Sulfuric Acid-Hydrogen Peroxide Mixture) operation (such as using $H_2SO_4$ and $H_2O_2$ solution) are performed in sequence. The liner protects the sidewall from being damaged by the sputter etching operation and the SPM operation. However, the liner is not perfectly adhesive to the sidewall and has a poor surface, such that an interface between the ILD layer and the etch stop layer is etched by the $H_2SO_4$ and $H_2O_2$ solution at SPM operation. In some conditions, a metal gate (MG) of the patterned substrate is also partially or entirely removed (which is also referred to as MG missing) by the $H_2SO_4$ and $H_2O_2$ solution etching, thus impacting the IC performance and yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
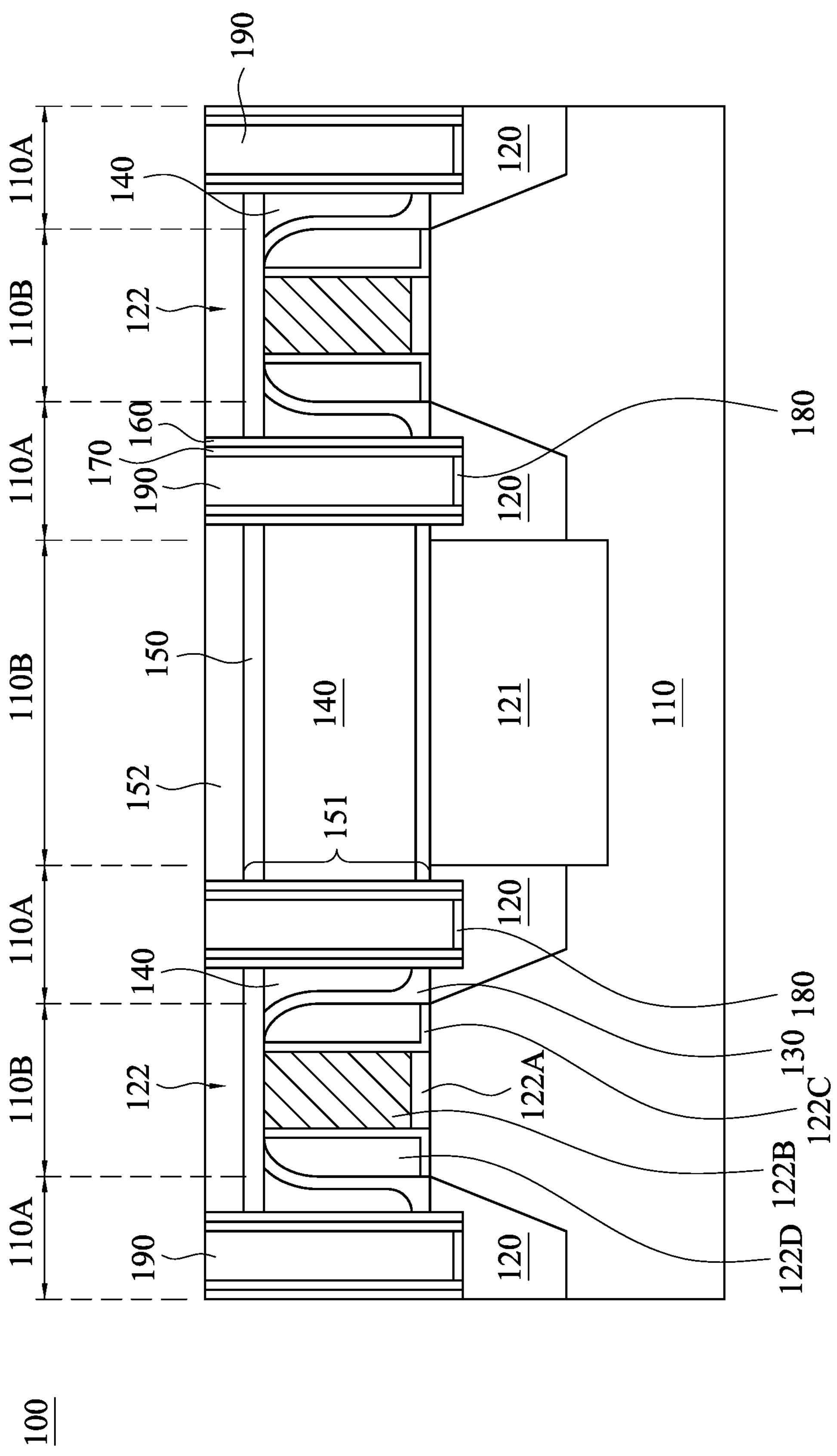
FIG. 1 is a schematic cross-sectional diagram of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "above" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to a semiconductor device (such as a signal device or a logic device) with a protective layer between a liner and a sidewall in an opening. The protective layer is formed from silicon oxide or silicon nitride for enhancing an adhesive effect between the liner and the sidewall, thereby preventing MG missing from occurring.

In various embodiments of the present disclosure, a method for fabricating a semiconductor device (such as a signal device or a logic device) is provided to prevent a metal gate of a patterned substrate from missing at SPM operation.

FIG. 1 is a schematic cross-sectional diagram of a semiconductor device 100 in accordance with some embodiments of the present disclosure. FIG. 1 has been simplified for the sake of clarity to better understand the inventive concepts of the present disclosure. The semiconductor device 100 may include memory cells and/or logic circuits; passive components such as resistors, capacitors, inductors, and/or fuses; active components, such as metal-oxide-semiconductor field effect transistors (MOSFETs), complementary metal-oxide-semiconductor transistors (CMOSs), p-channel metal-oxide-semiconductor field effect transistors (PFETs), n-channel metal-oxide-semiconductor field effect transistor (NFETs), high voltage transistors, and/or high frequency transistors; other suitable components; or combinations thereof. Additional features can be added in the semiconductor device 100, and some of the features described below can be replaced or eliminated for additional embodiments of the semiconductor device 100.

In FIG. 1, the semiconductor device 100 includes a substrate 110, an epi-layer 120, a first etch stop layer 130, an interlayer dielectric (ILD) layer 140, a second etch stop layer 150, a protective layer 160, a liner 170, a silicide cap 180 and a contact plug 190. In some embodiments, the substrate 110 is a semiconductor substrate including silicon. The substrate 110 may be a p-type or n-type substrate. Alternatively or additionally, the substrate 110 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In certain embodiments, the substrate 110 is a semiconductor on insulator (SOI). In alternative embodiments, the substrate 110 may include a doped epi layer, a gradient semiconductor layer, and/or a semiconductor layer overlying another semiconductor layer of a different type, such as a silicon layer on a silicon germanium layer. The substrate 110 may include various doped regions depending on design requirements of the semiconductor device 100 (e.g., p-type wells or n-type wells). The doped regions may be doped with p-type dopants, such as boron or $BF_2$; n-type dopants, such as phosphorus or arsenic; or a combination thereof. The doped regions may be disposed directly on the substrate 110, in a P-well structure, in a N-well structure, in a dual-well structure, or using a raised structure. In some embodiments, the substrate 110 has a first portion 110A and a second portion 110B adjacent to the first portion 110A.

The epi-layer 120 formed from such as silicon or silicon-germanium, is disposed in the first portion 110A of the substrate 110. In some embodiments, an epitaxy or epitaxial (epi) process may be used to form the epi-layer 120. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. The epi process may use gaseous and/or liquid precursors, which may interact with the composition of the substrate 110. The deposited semiconductor material provides stress or strain to the channel regions of the semiconductor device 100 to enhance carrier mobility of the device and enhance device performance. In the depicted embodiment, silicon germanium (SiGe) is deposited by an epi process to form a SiGe source and drain feature. The epi-layer 120 may be doped with a suitable dopant, such as boron (B). Alternatively, the source and drain feature is silicon (Si) source and drain features, which may be doped with a suitable dopant, such as carbon (C). The epi-layer 120 may be in-situ doped or undoped during the epi process, and then doped in a subsequent process. The doping may be achieved by an ion implantation process, plasma immersion ion implantation (PIII) process, gas and/or solid source diffusion process, other suitable process, or combinations thereof. The epi-layer 120 may further be exposed to an annealing process, such as a rapid thermal annealing process.

In some embodiments, an isolation feature 121 is disposed in the second portion 110B of the substrate 110 to isolate various regions of the substrate 110. For example, the isolation feature 121 defines active regions of the semiconductor device 100 in the substrate 110, in which various semiconductor devices (such as transistor devices) are disposed therein. The defined active regions may be referred to as oxide-defined active regions (put another way, OD regions of the semiconductor device 100). The isolation feature 121 utilizes isolation technology, such as local oxidation of silicon (LOCOS) and/or shallow trench isolation (STI), to define and electrically isolate the various regions. The isolation feature 121 includes silicon oxide, silicon nitride, silicon oxynitride, other suitable materials, or combinations thereof. In some embodiments, an STI is formed by the operations including a photolithography process, etching a trench in the substrate (for example, by using a dry etching, wet etching, or combinations thereof), and filling the trench (for example, by using a chemical vapor deposition process) with one or more dielectric materials. For example, the filled trench may have a multi-layer structure, such as a thermal oxide liner layer filled with silicon nitride or silicon oxide. In certain embodiments, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

Various gate structures 122 are disposed over the substrate 110. In some embodiments, the gate structures 122 are formed by deposition processes, lithography patterning processes, etching processes, or a combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include resist coating (such as spin-on coating), soft baking, mask aligning, exposure, post-exposure baking, developing the resist, rinsing, drying (such as hard baking), other suitable processes, or combinations thereof. Alternatively, the lithography exposing process is implemented or replaced by other proper methods, such as maskless photolithography, electron-beam writing, or ion-beam writing. The etching processes include dry etching, wet etching, other etching methods, or combinations thereof.

In the depicted embodiment, each of the gate structures 122 includes a gate dielectric layer 122A, a metal gate 122B, a spacer liner 122C, and a spacer 122D. The gate dielectric layer 122A and the metal gate 122B form a gate stack of the gate structures 122. The gate stack may include additional layers depending on design requirements of the semiconductor device 100. The gate dielectric layer 122A is disposed over the substrate 110 for the gate structures 122. The gate dielectric layer 122A includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, $Ta_2O_5$, $TiO_2$, $Al_2O_3$, $ZrO_2$, $Y_2O_3$, $L_2O_3$, other suitable materials, or combinations thereof. The gate dielectric layer 122A may include a multilayer structure. For example, the gate dielectric layer 122A may include an interfacial layer, and a high-k dielectric material layer formed on the interfacial layer. An exemplary interfacial layer may be a grown silicon oxide layer formed by a thermal process or ALD process.

The metal gate 122B is disposed over the gate dielectric layer 122A. In the depicted embodiment, the metal gate 122B is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the metal gate 122B includes a conductive layer having a proper work function, and therefore, the metal gate 122B can also be referred to as a work function layer. The work function layer includes any suitable material, such that the layer can be tuned to have a proper work function for enhanced performance of the associated device. For example, if a p-type work function metal (p-metal) for a PFET device is desired, the conductive layer may include TiN or TaN. On the other hand, if an n-type work function metal (n-metal) for an NFET device is desired, the conductive layer may include Ta, TiAl, TiAlN, or TaCN. The work function layer may include doped conducting oxide materials. The metal gate 122B may include other conductive materials, such as aluminum, copper, tungsten, metal alloys, metal silicide, other suitable materials, or combinations thereof.

The spacer liner 122C and the spacer 122D are disposed along sidewalls of the gate stack of the gate structures 122 (such as along sidewalls of the gate dielectric layer 122A and the metal gate 122B). In the depicted embodiment, the spacer liner 122C includes an oxide material, such as silicon oxide, and the spacer 122D includes a nitride material, such as silicon nitride. Alternatively, the spacer 122D includes another suitable dielectric material, such as silicon oxide, silicon oxynitride, or combinations thereof. The spacer liner 122C may also include another suitable dielectric material. The spacer liner 122C and the spacer 122D are formed by a suitable process. For example, the spacer liner 122C and the spacer 122D are formed by blanket depositing a first dielectric layer (a silicon oxide layer) over the semiconductor device 100 and a second dielectric layer (a silicon nitride layer) over the first dielectric layer, and then, anisotropically etching to remove the dielectric layers to form the spacer liner 122C and the spacer 122D as illustrated in FIG. 1.

The semiconductor device 100 may include additional features that are not illustrated. For example, lightly doped source/drain (LDD) regions and/or heavily doped source/drain (HDD) regions may be formed by ion implantation or diffusion of n-type dopants, such as phosphorous or arsenic, or p-type dopants, such as boron. The LDD and/or HDD regions may be interposed by the respective gate structures 122.

The first etch stop layer 130 is disposed on the second portion 110B of the substrate 110 for preventing problems caused by contact misalignment. In some embodiments, the first etch stop layer 130 may be formed from commonly used materials including, but not limited to, SiNx, SiOx, SiON, SiC, SiCN, BN, SiBN, SiCBN, and combinations thereof. In alternative embodiments, the first etch stop layer 130 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used.

The interlayer (or inter-level) dielectric (ILD) layer 140 formed from a dielectric layer, for example, is disposed on the first etch stop layer 130. The ILD layer 140 includes a dielectric material, such as silicon oxide, silicon nitride, silicon oxynitride, low-k dielectric material, other suitable dielectric materials, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. The ILD layer 140 may include a multilayer structure having multiple dielectric materials, and additional layers may be disposed overlying and/or underlying the ILD layer 140. A chemical mechanical polishing (CMP) process of the ILD layer 140 may be performed until the metal gate 122B of the gate structures 122 is exposed as illustrated in FIG. 1.

The second etch stop layer 150 is disposed on the ILD layer 140 for preventing problems caused by contact misalignment. In some embodiments, the second etch stop layer 150 may be formed from commonly used materials including, but not limited to, SiNx, SiOx, SiON, SiC, SiCN, BN, SiBN, SiCBN, and combinations thereof. In alternative embodiments, the second etch stop layer 150 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used. In some embodiments, an inter-metal dielectric layer 152 is disposed on the second etch stop layer 150.

Further, the first etch stop layer 130, the ILD layer 140 and the second etch stop layer 150 form a sidewall 151 surrounding the first portion 110A. The protective layer 160 is disposed on the sidewall 151, in which the protective layer 160 is formed from oxide or nitride. In some embodiments, the protective layer 160 is formed from silicon oxide or silicon nitride. In certain embodiments, the protective layer 160 is formed using a chemical vapor deposition (CVD) process, a physical vapor deposition (PVD) process or a high density plasma (HDP) process. In some embodiments, the protective layer 160 has a thickness in a range from about 1 nm to about 1.8 nm, and the opening has a size in a range from about 15 nm to about 21 nm. In certain embodiments, a ratio of the thickness to the size is in a range from about 0.04 to 0.12. The effect of the protective layer 160 will be described later.

The liner 170 is disposed on the protective layer 160. In some embodiments, the liner 170 is formed from silicon nitride, silicon oxy-nitride, silicon carbide or silicon oxycarbide. In certain embodiments, the protective layer 160 formed from oxide or nitride may be used for enhancing an adhesive effect between the sidewall 151 and the liner 170, thereby preventing the metal gate 122B from being etched when a SPM operation is performed, thus preventing the MG missing caused by the SPM operation. In alternative embodiments, the protective layer 160 itself may also be used to protect the metal gate 122B from being etched when the SPM operation is performed, thus preventing the MG missing caused by the SPM operation. Therefore, the IC performance and yield are improved.

The silicide cap 180 is disposed on the epi-layer 120. In some embodiments, the silicide cap 180 is formed from titanium silicide, nickel silicide, cobalt silicide, platinum silicide, palladium silicide, tungsten silicide, tantalum silicide or erbium silicide. In alternative embodiments, the silicide cap 180 is formed by the operation of forming a metal layer (not shown) on the epi-layer 120 and then annealing the metal layer. The operation of forming the metal layer on the epi-layer 120 may be performed using a chemical vapor deposition (CVD) process, a physical vapor deposition (PVD) process or a high density plasma (HDP) process.

The contact plug 190 is disposed on the silicide cap 180 and is surrounded by the liner 170, such that the contact plug 190 is electrically connected to the epi-layer 120 via the silicide cap 180. In some embodiments, the contact plug 190 includes aluminum (Al), tungsten (W), or copper (Cu), etc. In alternative embodiments, the contact plug 190 is formed using a CVD process.

Figure 2:
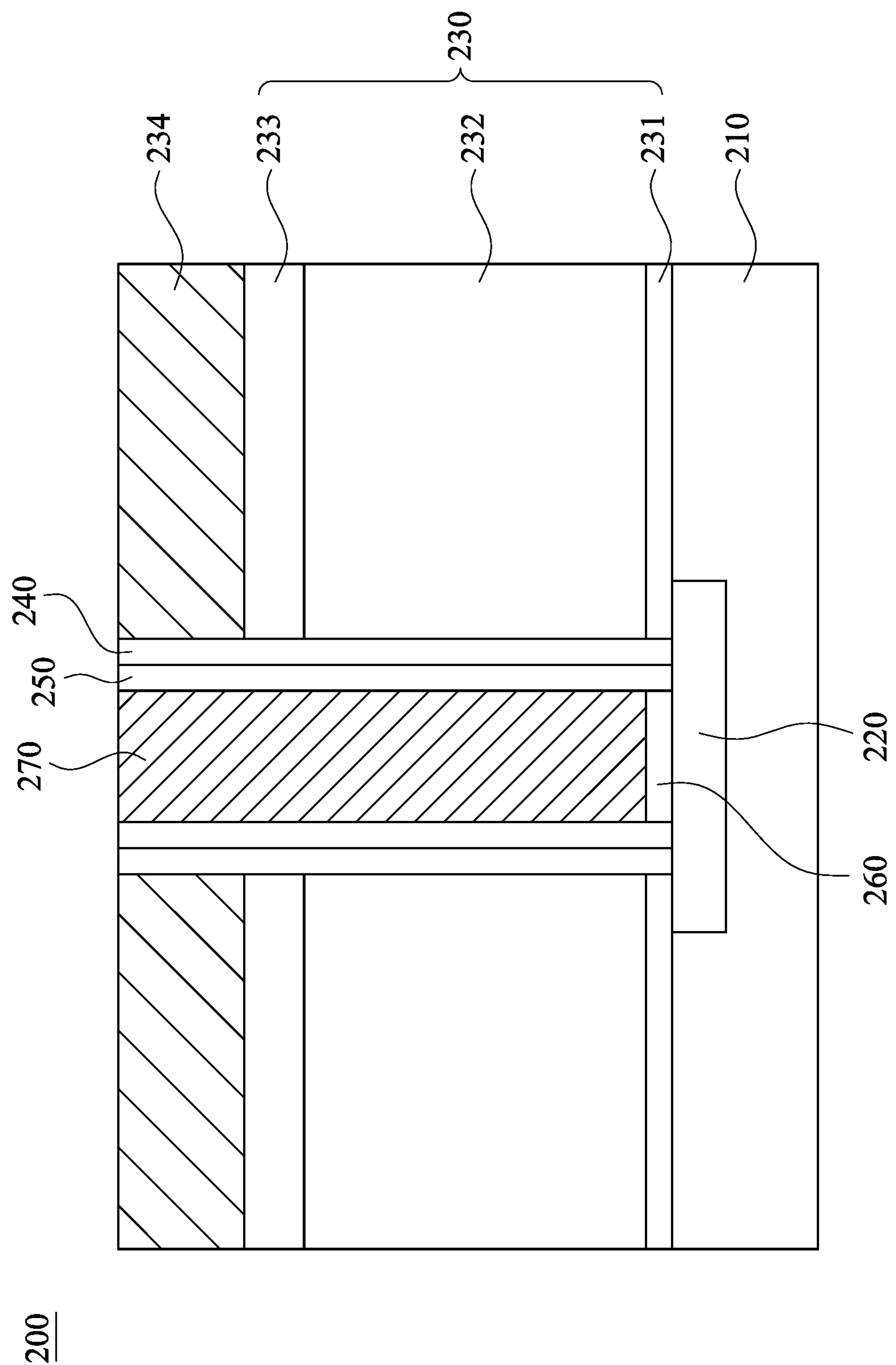
FIG. 2 is a schematic cross-sectional diagram of a semiconductor device in accordance with certain embodiments of the present disclosure.

FIG. 2 is a schematic cross-sectional diagram of a semiconductor device 200 in accordance with certain embodiments of the present disclosure. As shown in FIG. 2, the semiconductor device 200 includes a substrate 210, an epi-layer 220, a dielectric layer 230, an inter-metal dielectric layer 234, a protective layer 240, a liner 250, a silicide cap 260 and a contact plug 270. In some embodiments, the substrate 210, the epi-layer 220, the inter-metal dielectric layer 234, the protective layer 240, the liner 250, the silicide cap 260 and the contact plug 270 may be formed from the materials similar to the materials forming the silicon-based substrate 110, the epi-layer 120, the inter-metal dielectric layer 152, the protective layer 160, the liner 170, the silicide cap 180 and the contact plug 190, respectively. The dielectric layer 230 may include a first etch stop layer 231, an interlayer dielectric (ILD) layer 232, a second etch stop layer 233. In some embodiments, the first etch stop layer 231, the interlayer dielectric (ILD) layer 232, and the second etch stop layer 233 may be formed from the materials similar to the materials forming the first etch stop layer 130, the interlayer dielectric (ILD) layer 140, the second etch stop layer 150.

Figure 3A:
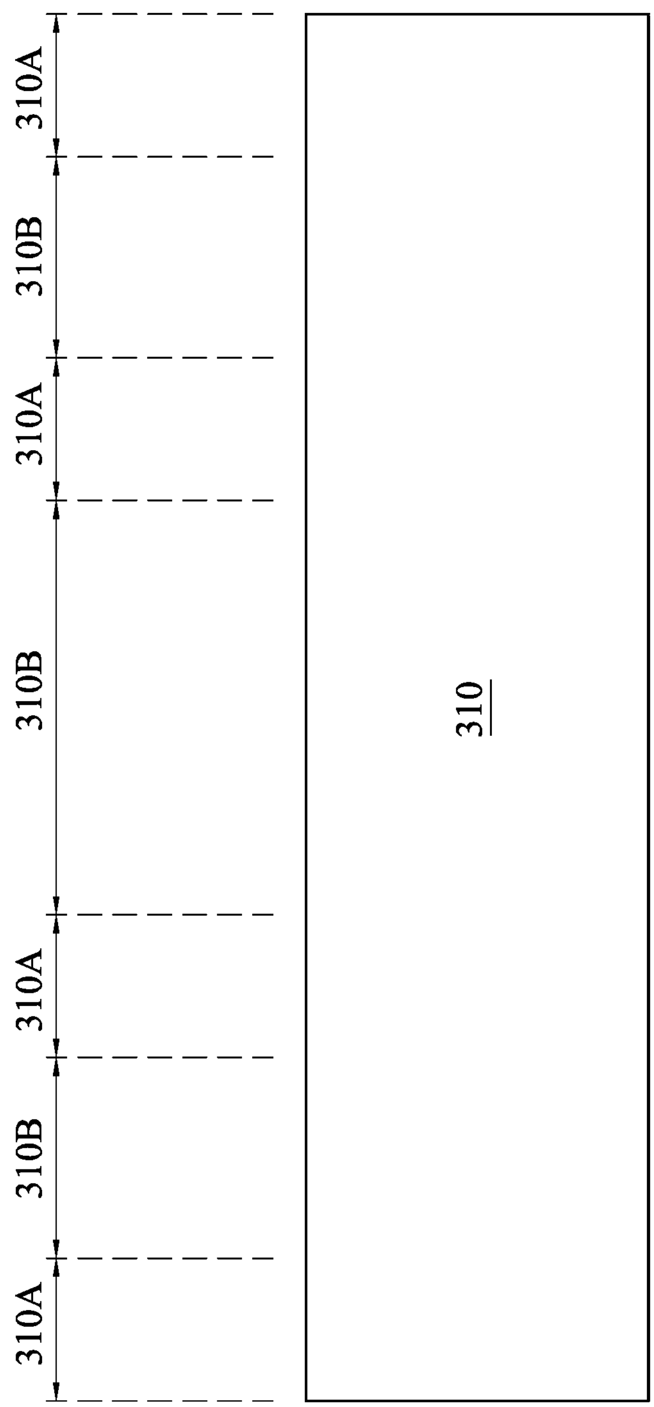
FIG. 3A to FIG. 3P are schematic cross-sectional views of intermediate stages showing a method for fabricating a semiconductor device in accordance with some embodiments of the present disclosure.
Figure 3B:
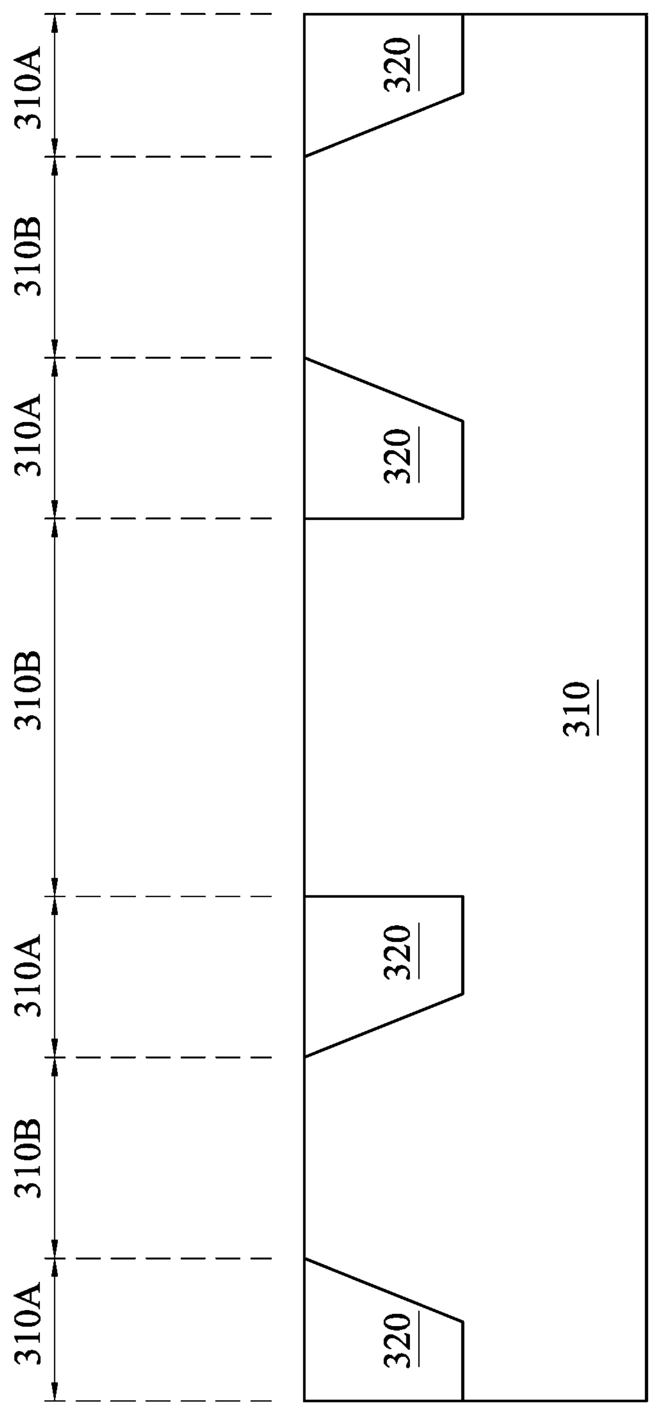
Figure 3C:
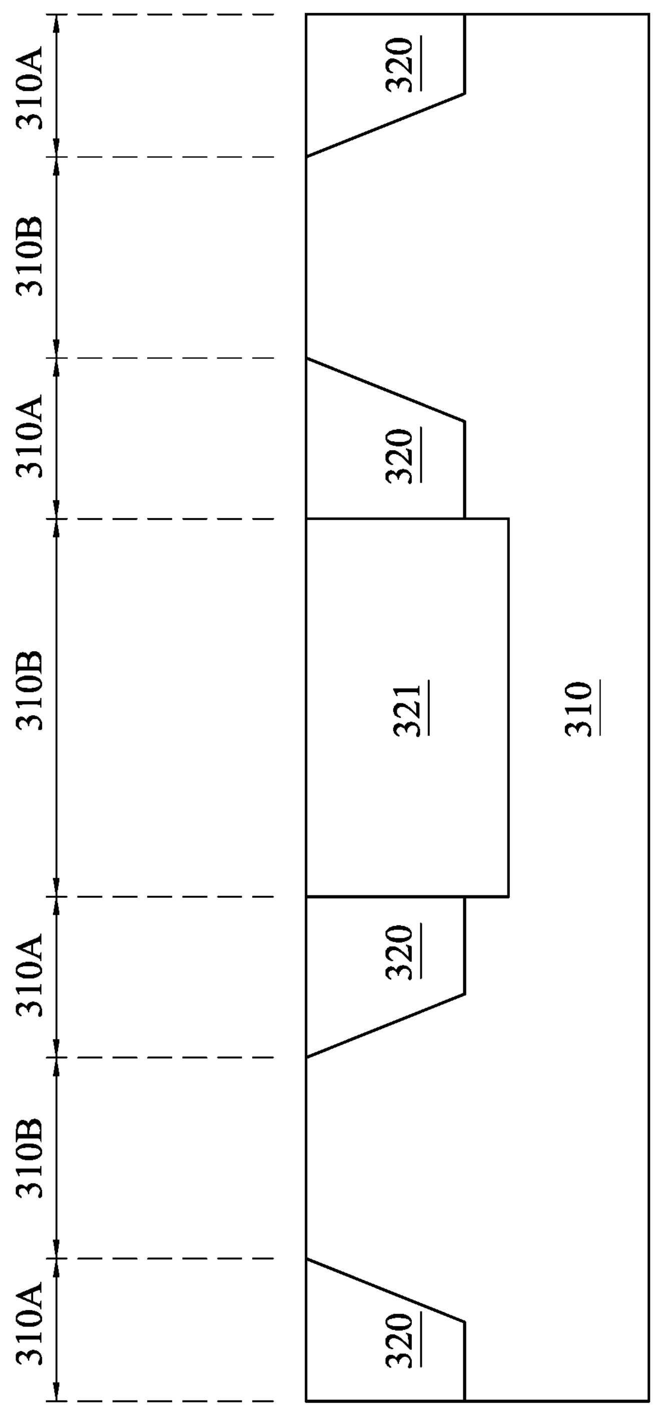
Figure 3D:
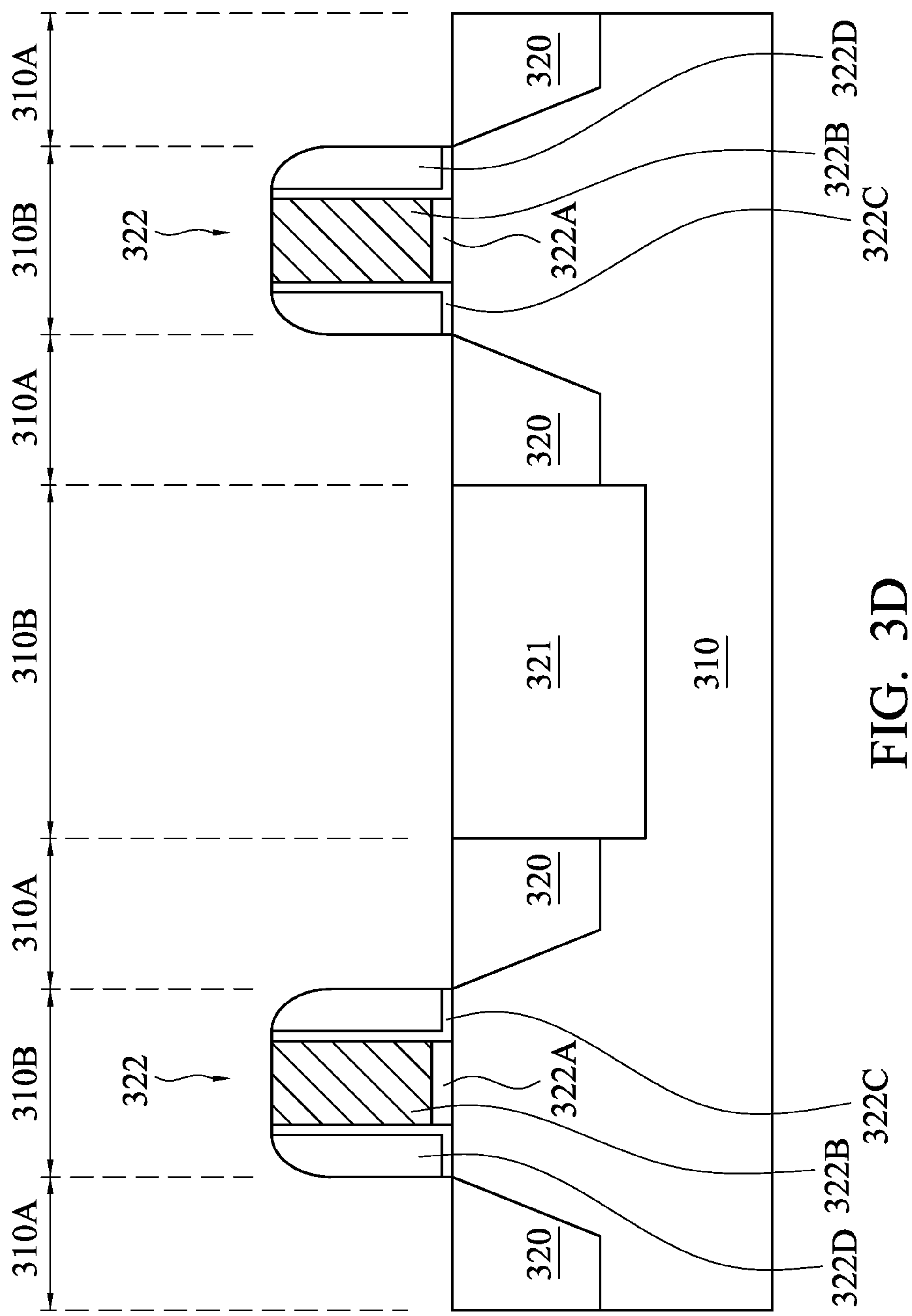
Figure 3E:
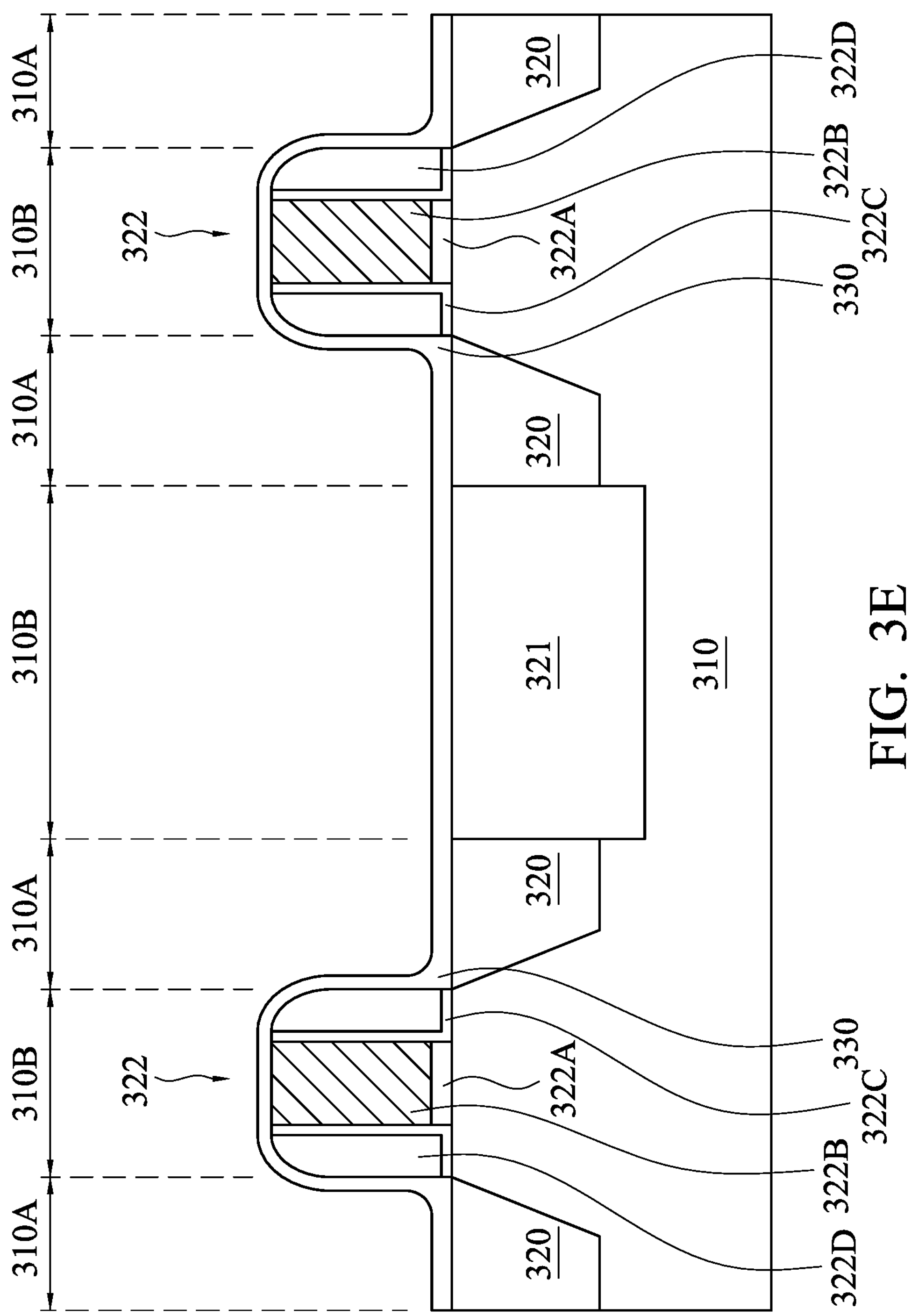
Figure 3F:
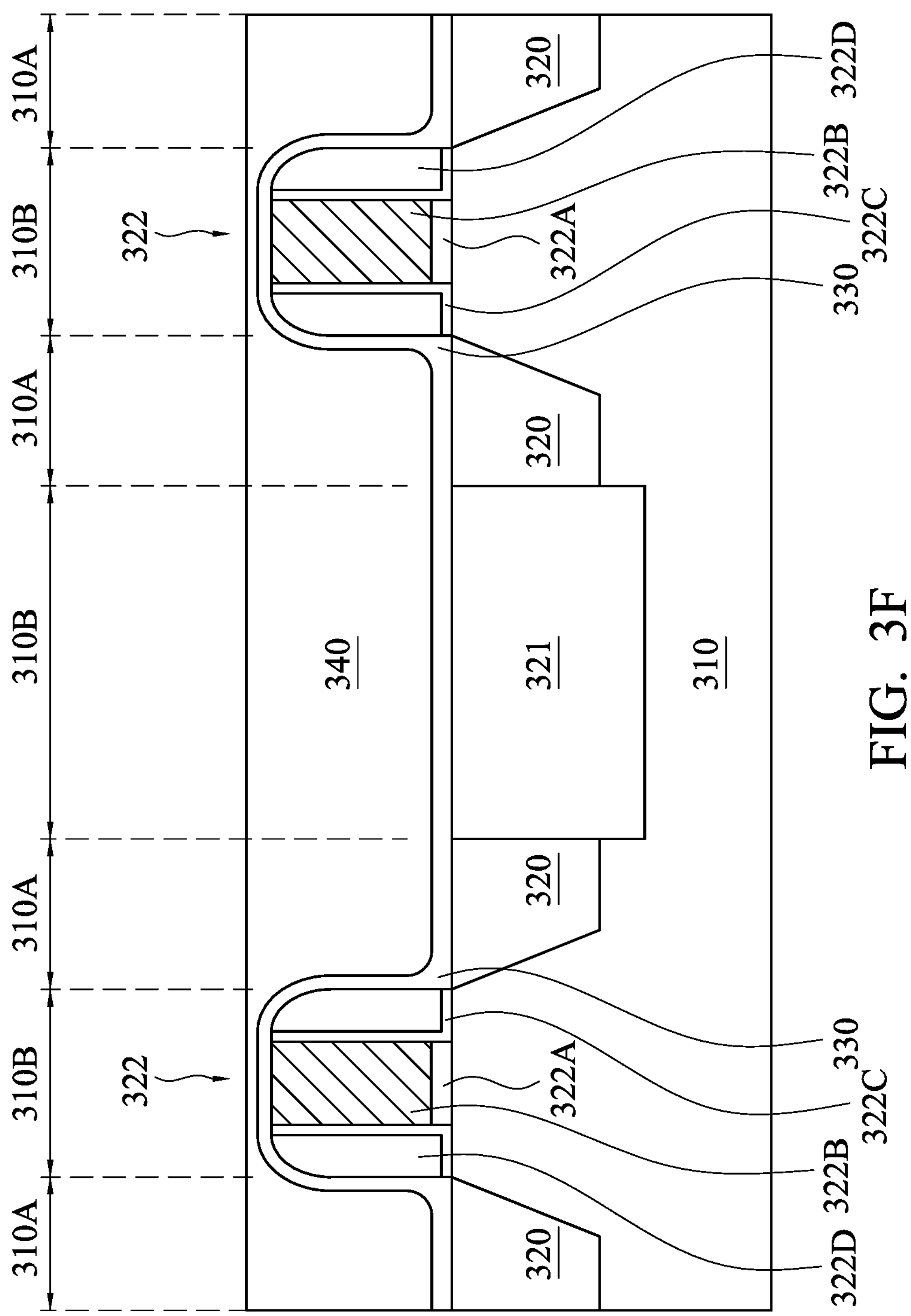
Figure 3G:
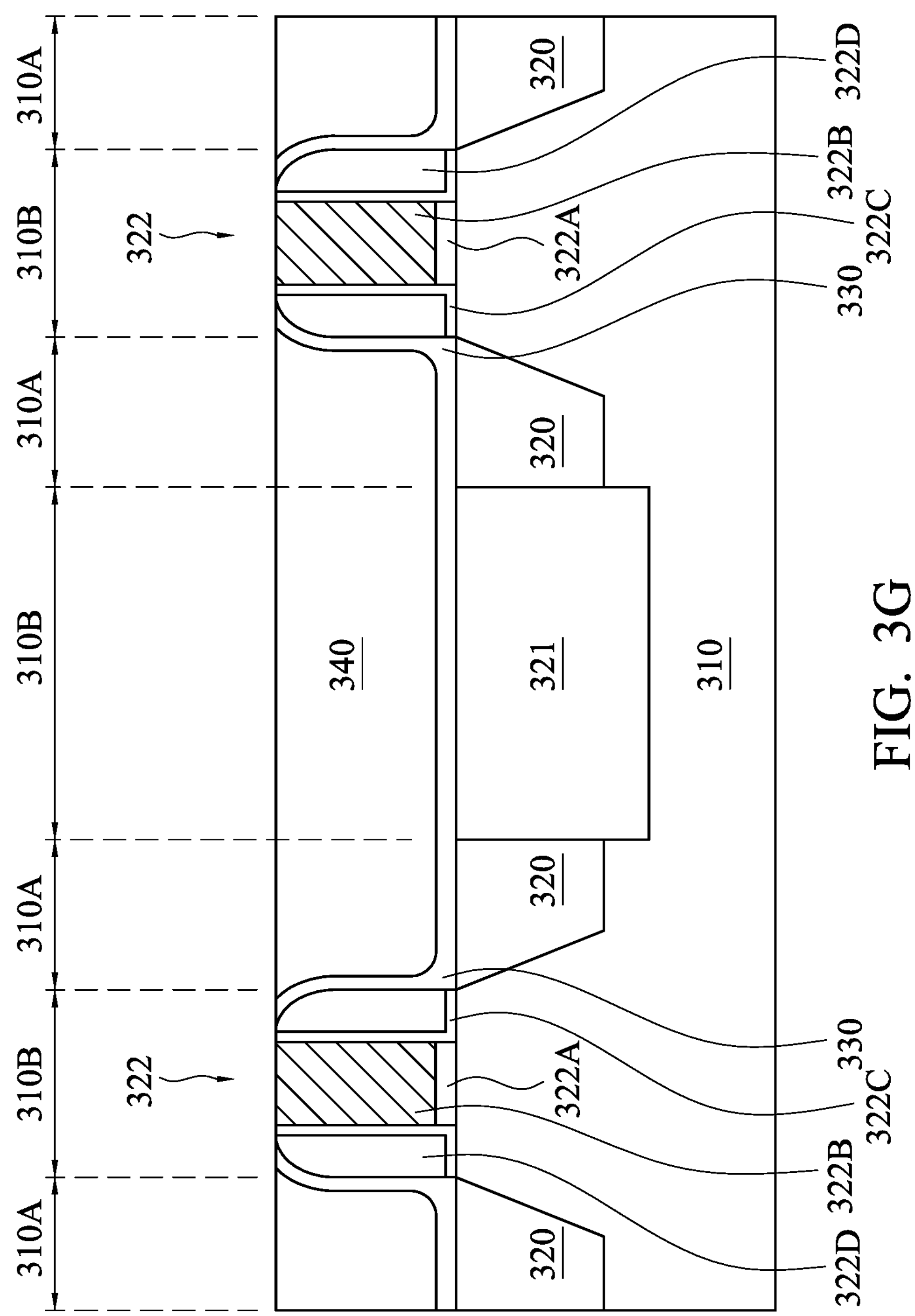
Figure 3H:
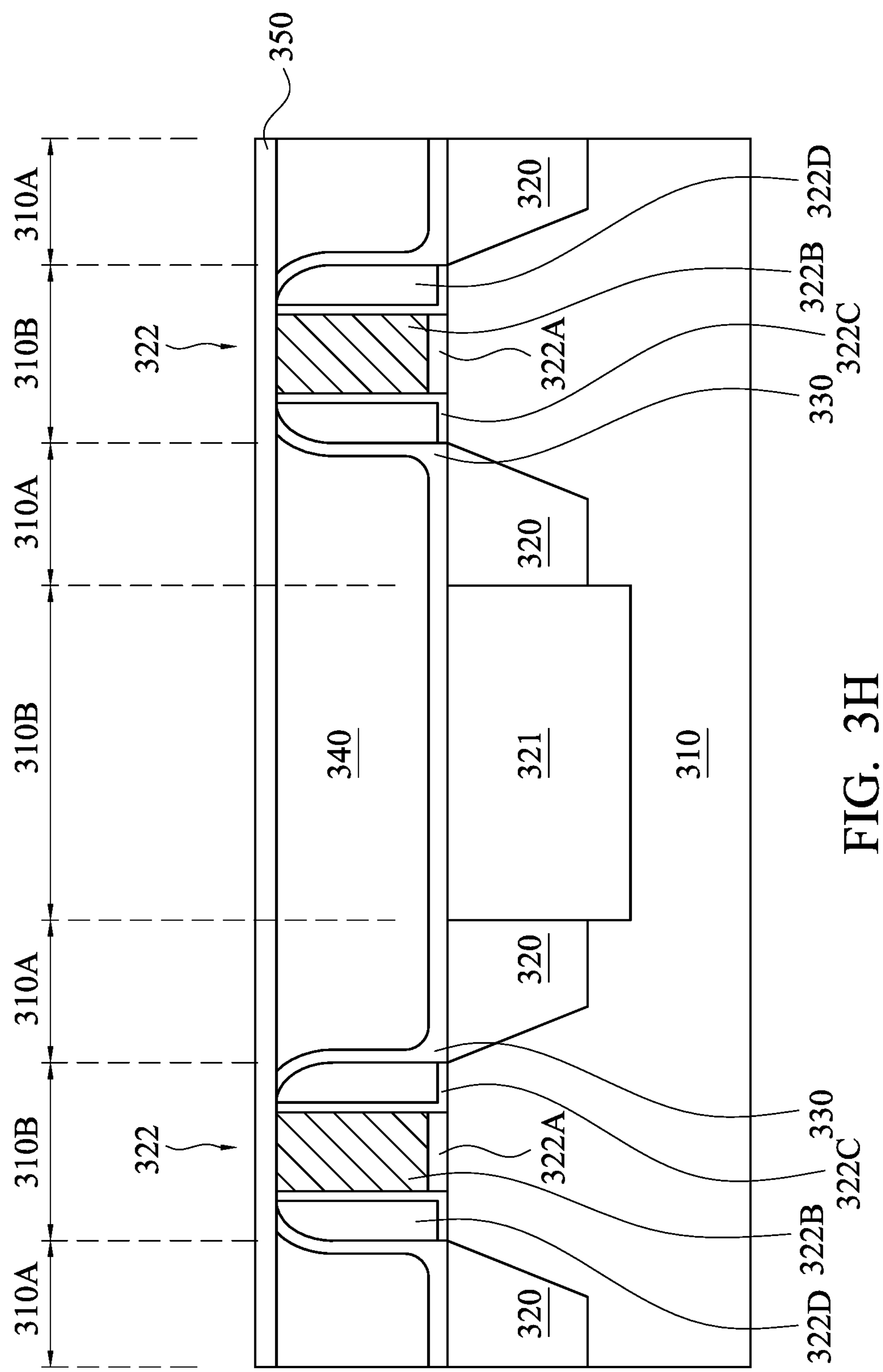
Figure 3I:
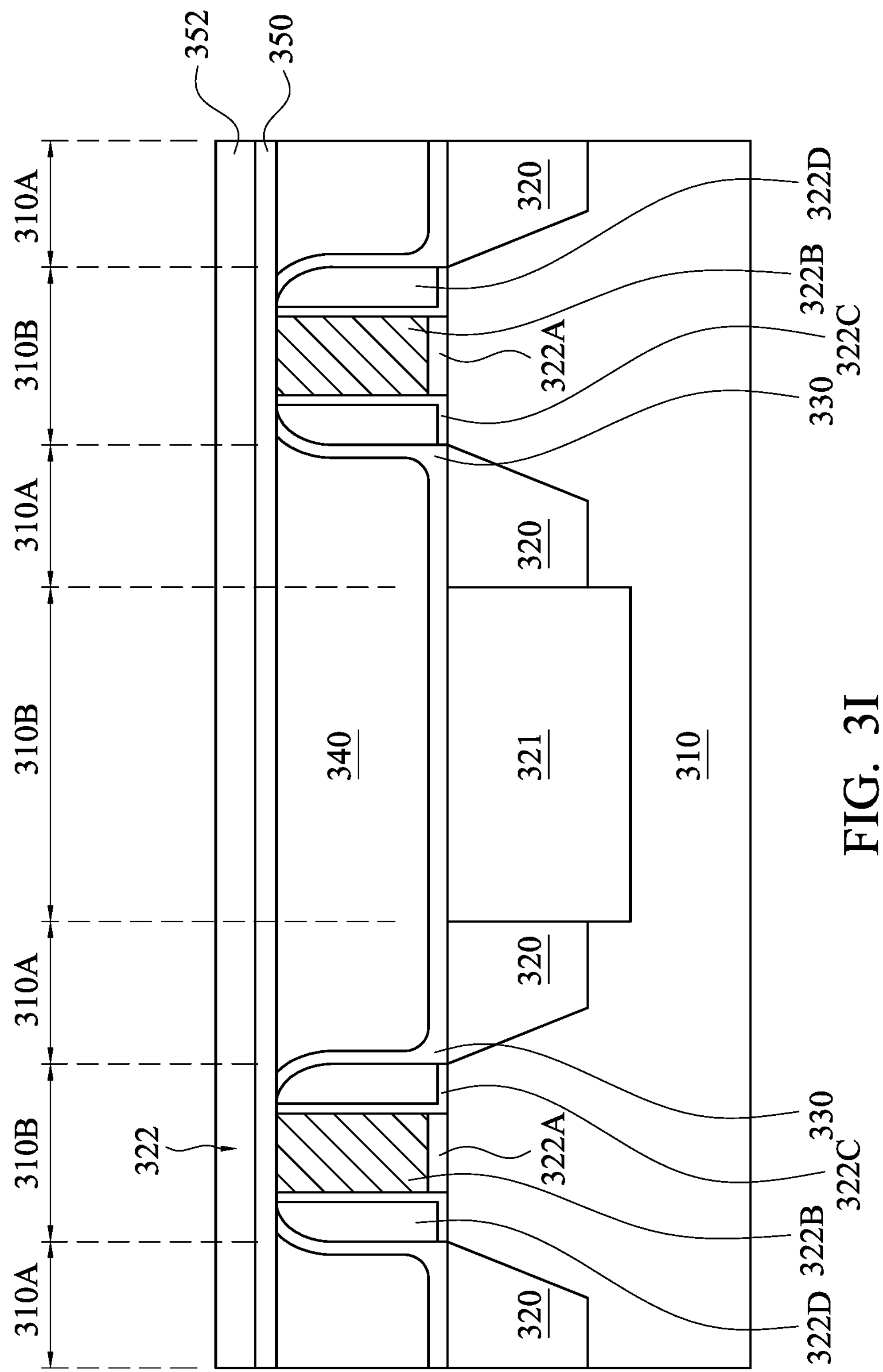
Figure 3J:
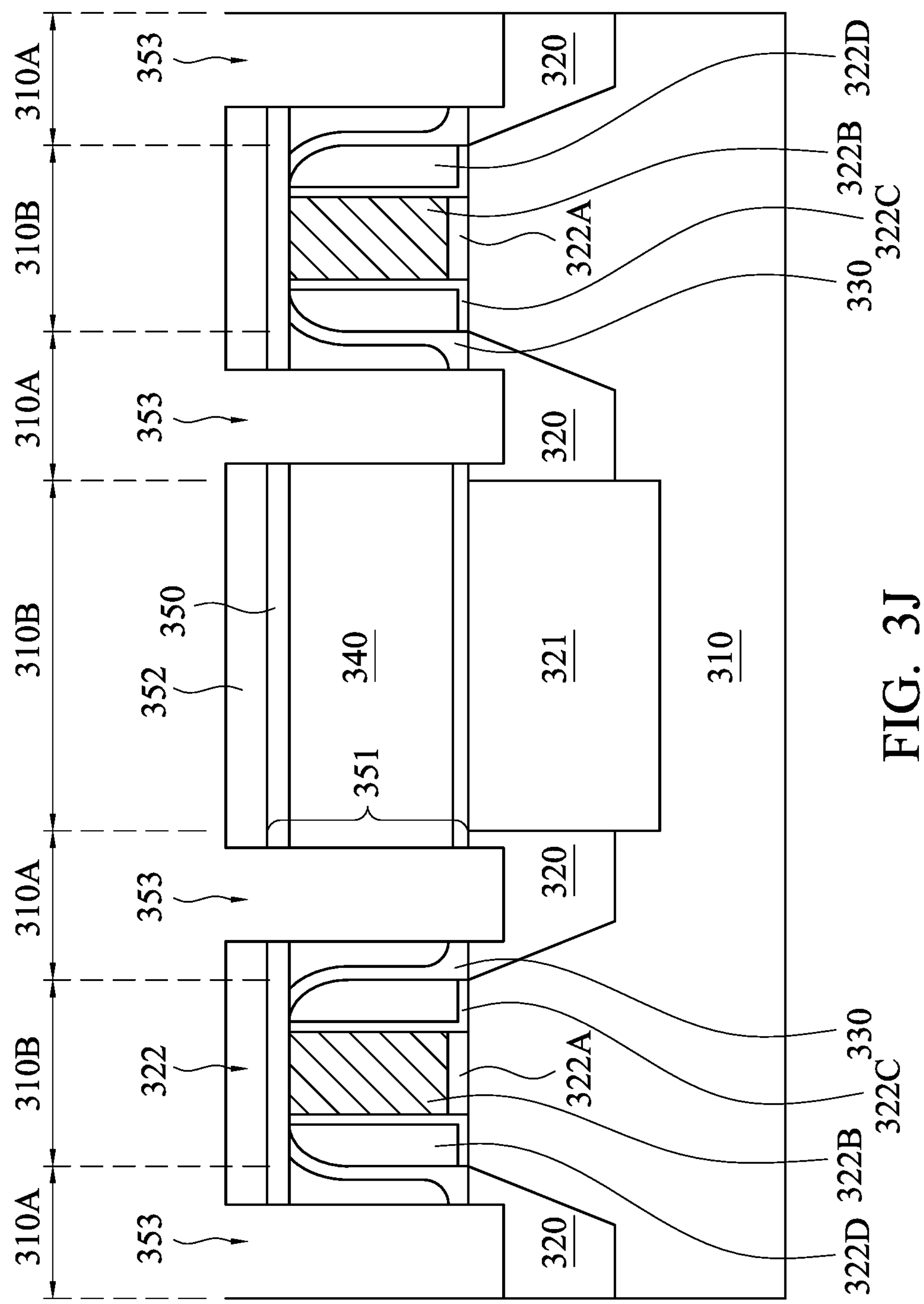
Figure 3K:
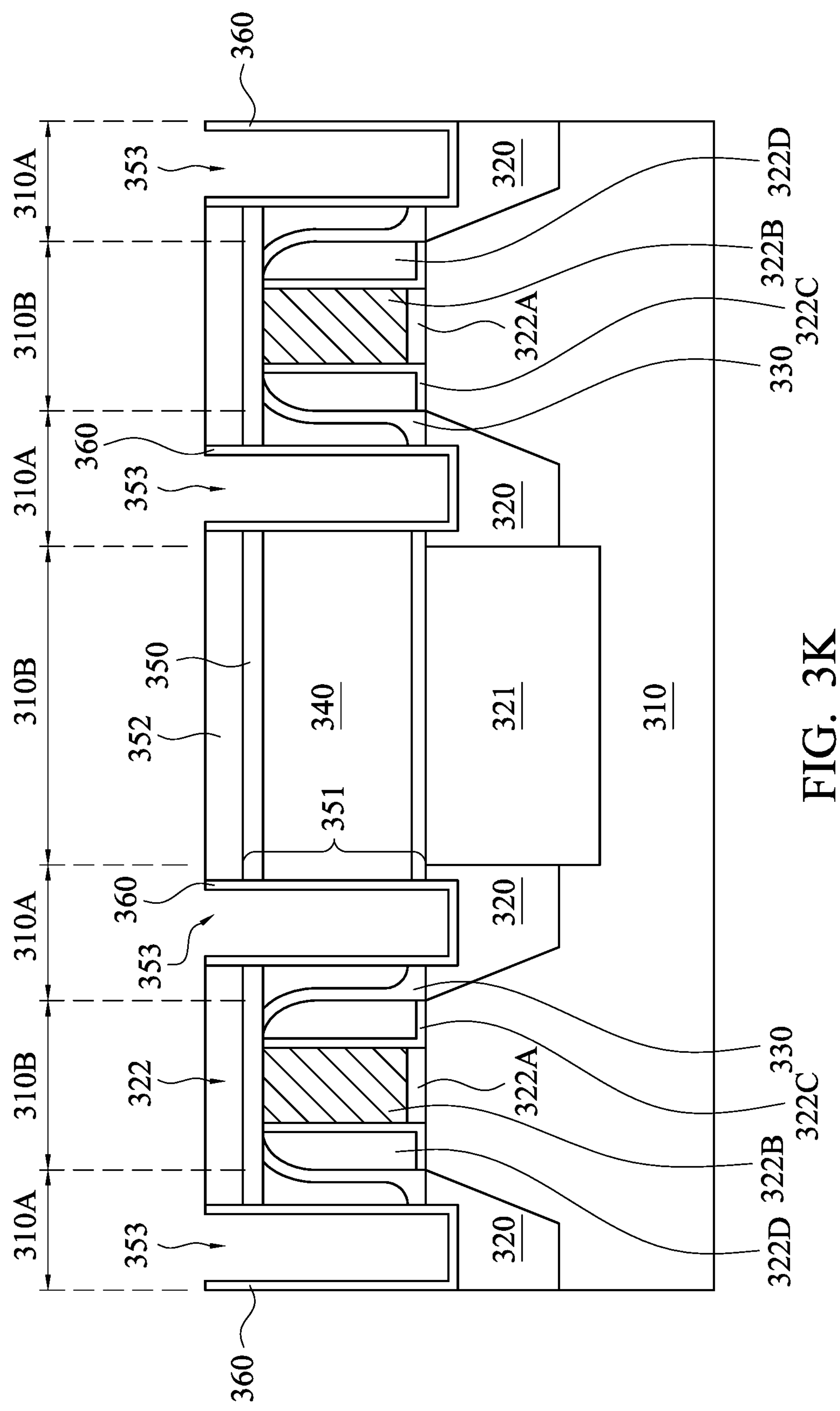
Figure 3L:
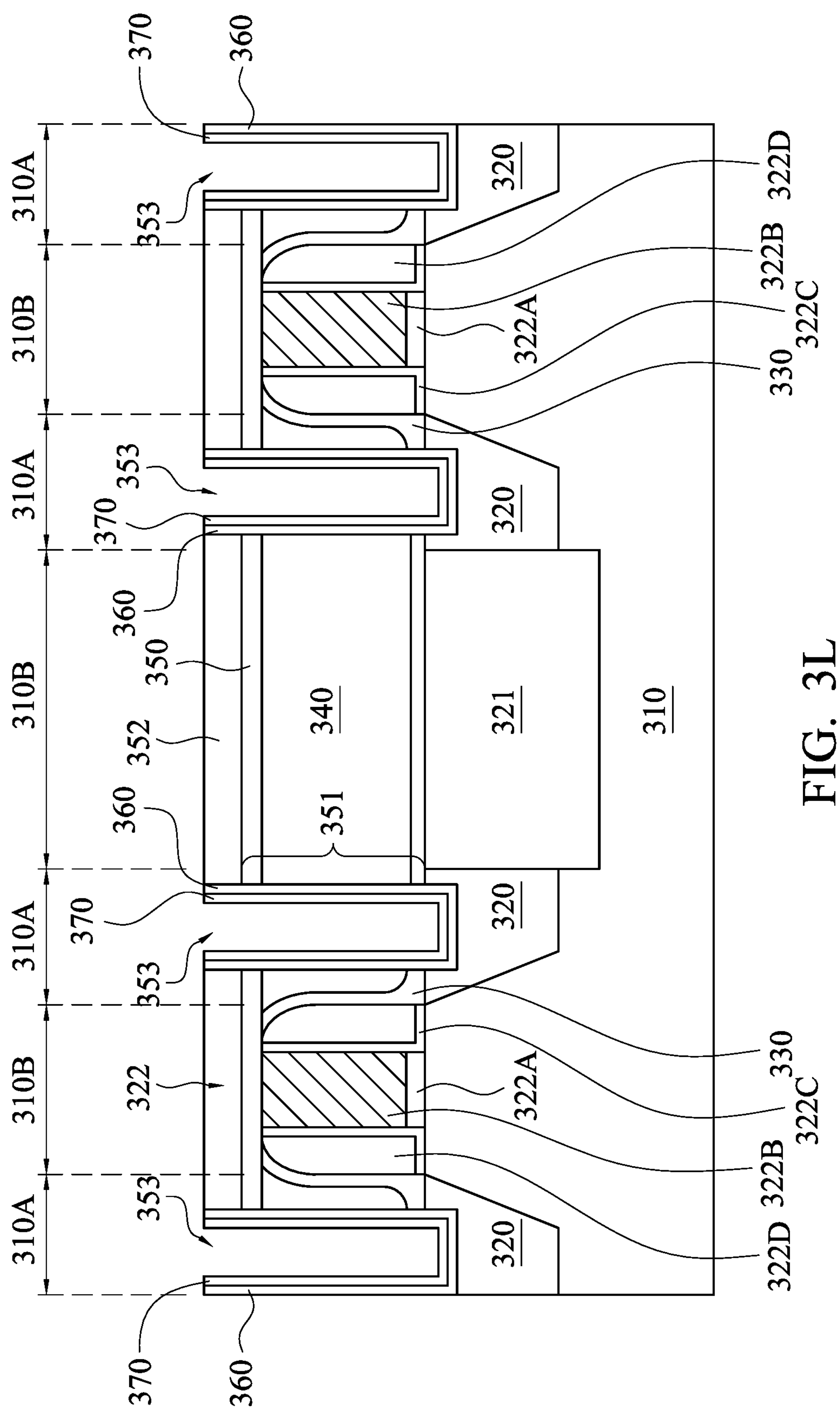
Figure 3M:
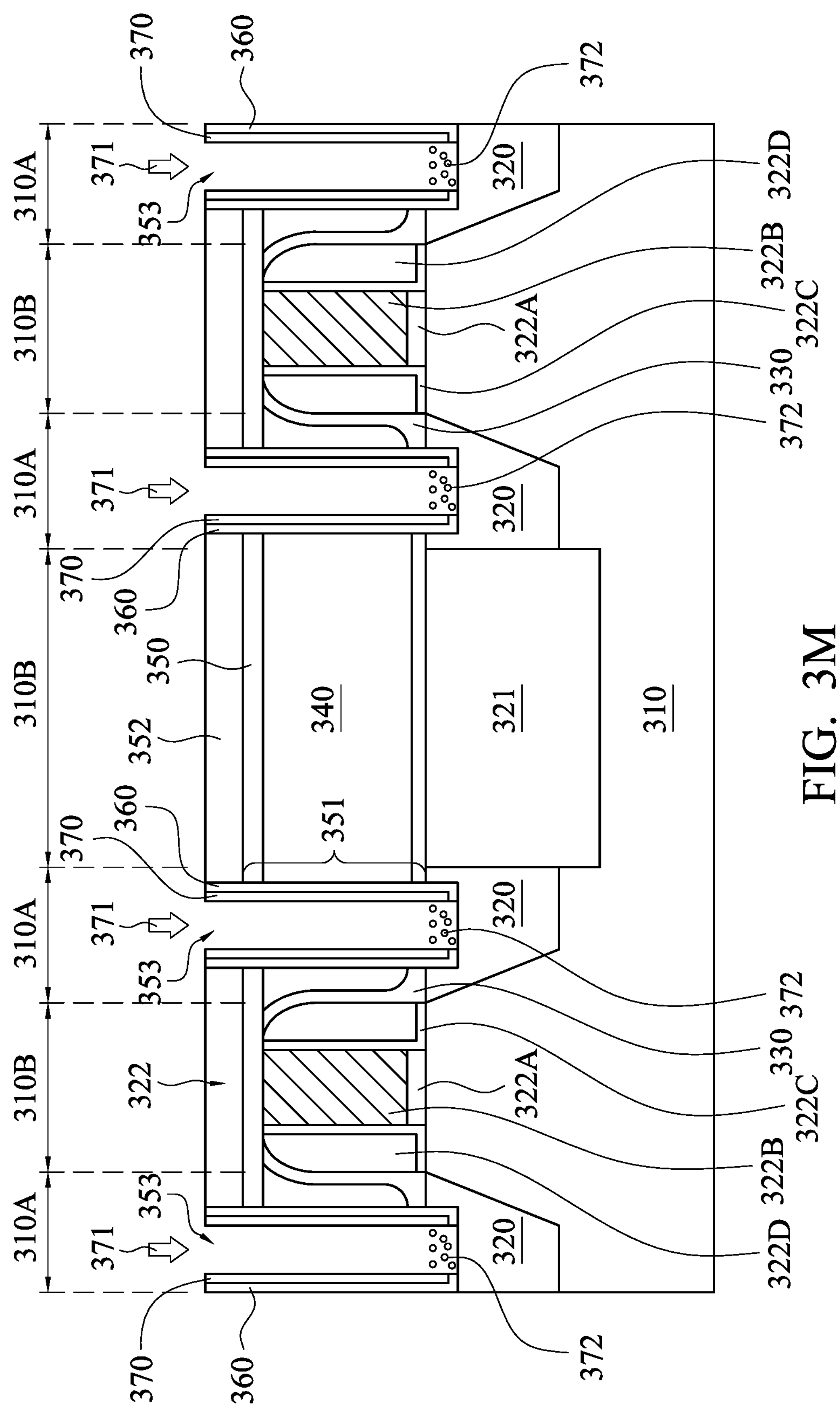
Figure 3N:
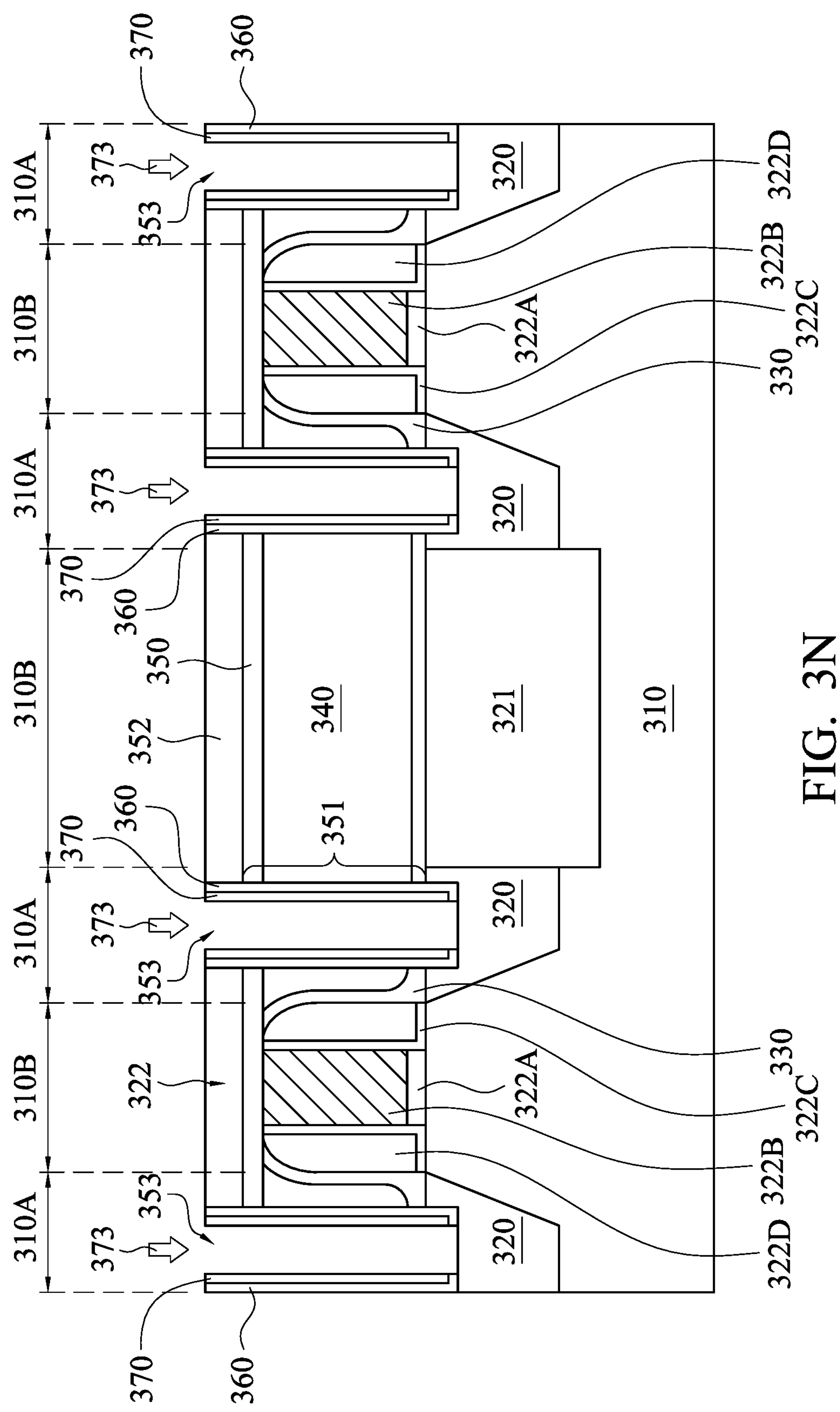
Figure 3O:
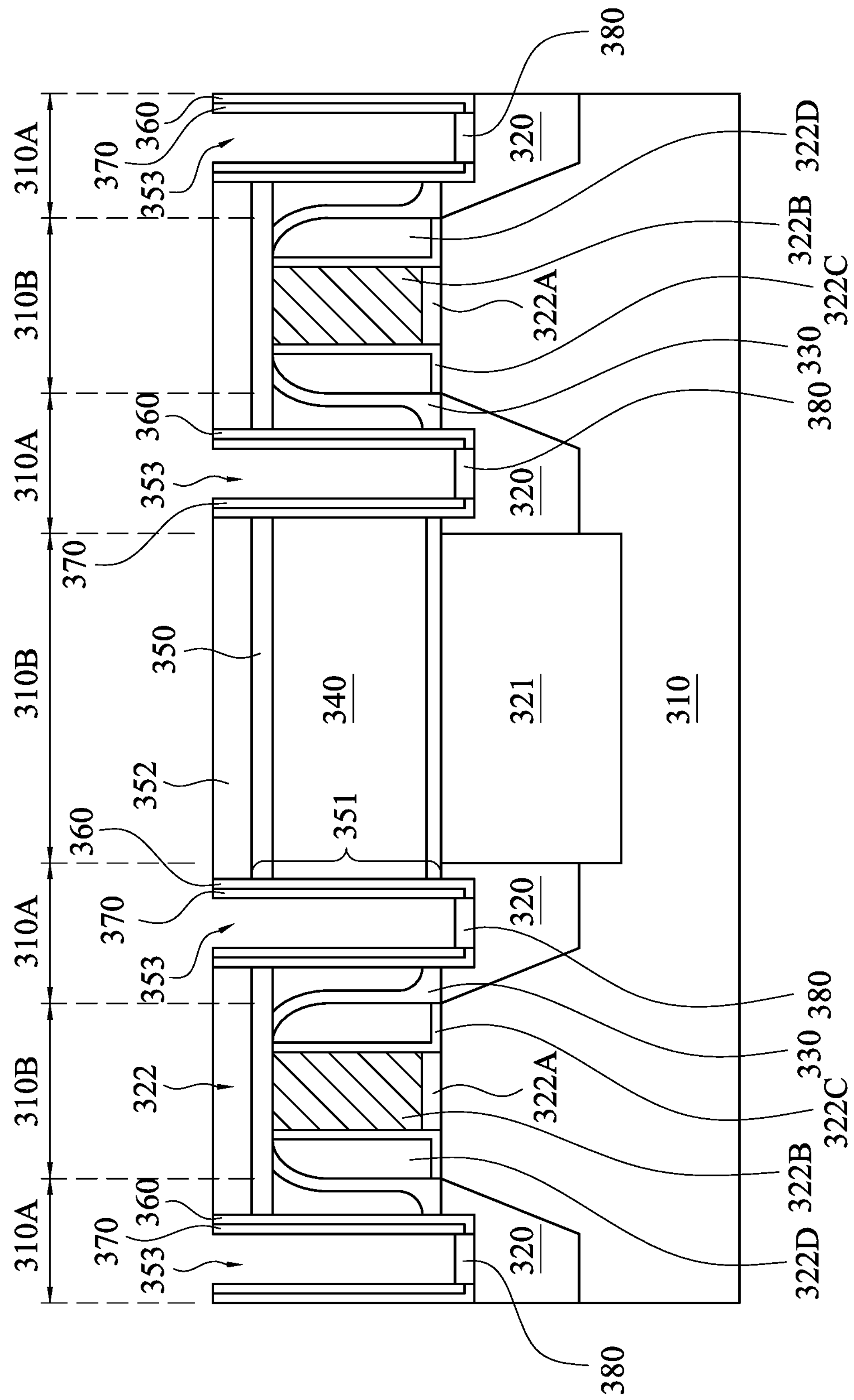
Figure 3P:
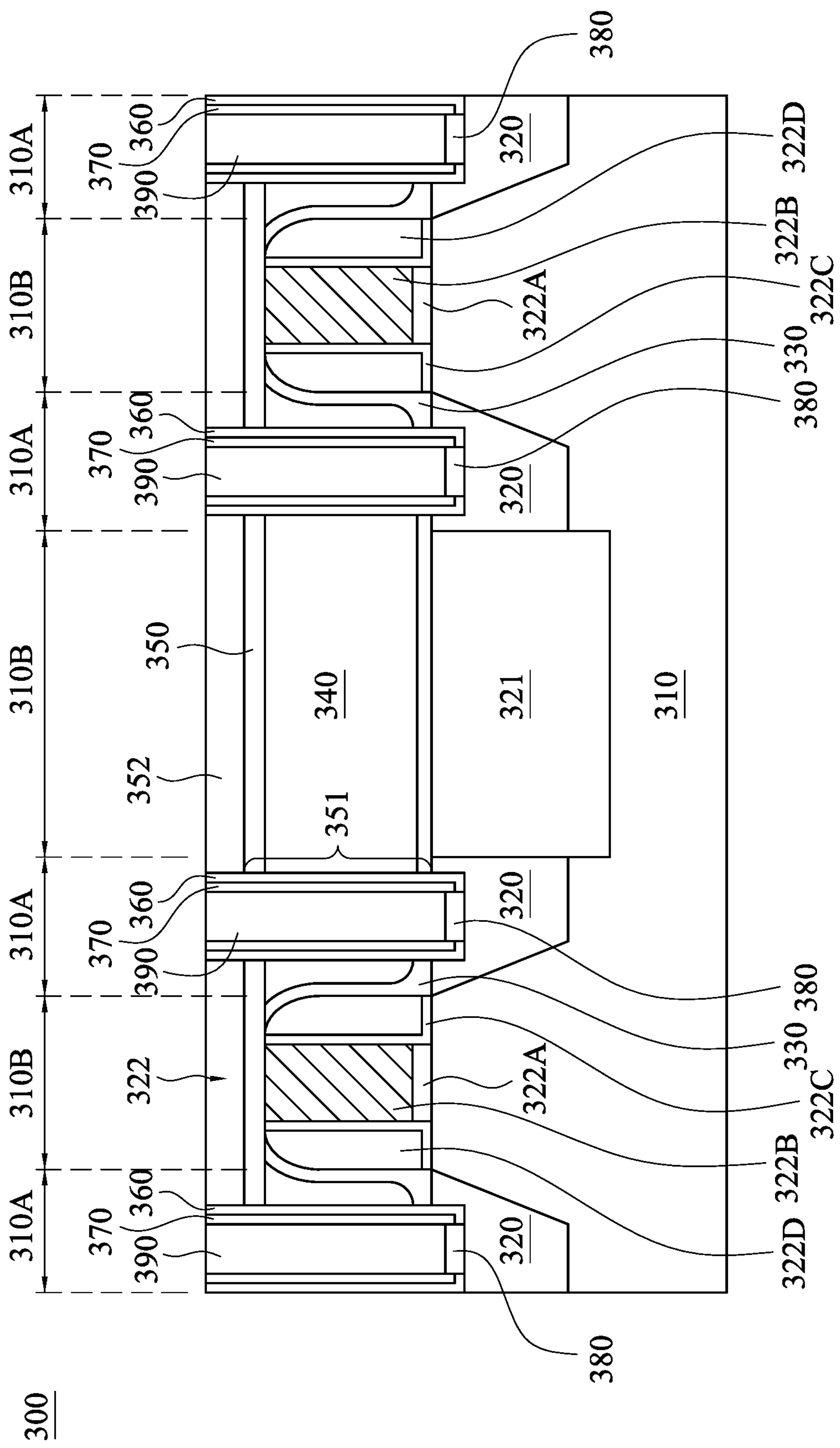

FIG. 3A to FIG. 3P are schematic cross-sectional views of intermediate stages showing a method for fabricating a semiconductor device 300 in accordance with some embodiments of the present disclosure. As shown in FIG. 3A, a substrate 310 is provided, in which the substrate has a first portion 310A and a second portion 310B adjacent to the first portion 310A. In some embodiments, the substrate 310 may be formed from the materials similar to the materials forming the substrate 110.

As shown in FIG. 3B, an epi-layer 320 is formed in the first portion 310A. In some embodiments, the epi-layer 320 may be formed from the materials similar to the materials forming the epi-layer 120. In certain embodiments, the epi-layer 320 may be formed using the processes similar to the processes forming the epi-layer 120.

As shown in FIG. 3C, an isolation feature 321 is formed in the second portion 310B. In some embodiments, the isolation feature 321 may be formed from the materials similar to the materials forming the isolation feature 121. In certain embodiments, the isolation feature 321 may be formed using the processes similar to the processes forming the isolation feature 121.

As shown in FIG. 3D, various gate structures 322 are formed on the second portions 122B of the substrate 310. Each of the gate structures 322 includes a gate dielectric layer 322A, a metal gate 322B, a spacer liner 322C, and a spacer 322D. In some embodiments, the gate dielectric layer 322A, the metal gate 322B, the spacer liner 322C, and the spacer 322D may be formed from the materials similar to the materials forming the gate dielectric layer 122A, the metal gate 122B, the spacer liner 122C, and the spacer 122D, respectively. In certain embodiments, the gate dielectric layer 322A, the metal gate 322B, the spacer liner 322C, and the spacer 322D may be formed using the processes similar to the processes forming the gate dielectric layer 122A, the metal gate 122B, the spacer liner 122C, and the spacer 122D, respectively.

As shown in FIG. 3E, a first etch stop layer 330 is formed on the second portion 310B and the epi-layer 320. In some embodiments, the first etch stop layer 330 may be formed from the materials similar to the materials forming first etch stop layer 130. In certain embodiments, the first etch stop layer 330 may be formed using the processes similar to the processes forming the first etch stop layer 130.

As shown in FIG. 3F, an interlayer dielectric (ILD) layer 340 is formed on the first etch stop layer 330. In some embodiments, the interlayer dielectric (ILD) layer 340 may be formed from the materials similar to the materials forming the interlayer dielectric (ILD) layer 140. In certain embodiments, the interlayer dielectric (ILD) layer 340 may be formed using the processes similar to the processes forming the interlayer dielectric (ILD) layer 140. In some embodiments, a chemical mechanical polishing (CMP) process may be performed on the interlayer dielectric (ILD) layer 340 and the first etch stop layer 330 to expose the metal gate 322, as shown in FIG. 3G.

As shown in FIG. 3H, a second etch stop layer 350 is formed on the ILD layer 340 to cover the metal gate 322. In some embodiments, the second etch stop layer 350 may be formed from the material similar to that forming the second etch stop layer 150. In certain embodiments, the second etch stop layer 350 may be formed using the processes similar to the processes forming the second etch stop layer 150.

As shown in FIG. 3I, an inter-metal dielectric layer 352 is formed on the second etch stop layer 350. In some embodiments, the inter-metal dielectric layer 352 may be formed from the materials similar to the materials forming the inter-metal dielectric layer 152. In certain embodiments, the inter-metal dielectric layer 352 may be formed using the processes similar to the processes forming the inter-metal dielectric layer 152.

As shown in FIG. 3J, a portion of the first etch stop layer 330, a portion of the ILD layer 340 and a portion the second etch stop layer 350 on the first portion 310A are etched to form an opening 353, in which the remaining portion of the first etch stop layer 330, the remaining portion of the ILD layer 340 and the remaining portion of the second etch stop layer 350 form a sidewall 351 of the opening 353. In some embodiments, the portion of the first etch stop layer 330, the portion of the ILD layer 340 and the portion of the second etch stop layer 350 may be etched using a dry etching process or a wet etching process.

As shown in FIG. 3K, a protective layer 360 is deposited on the sidewall 351 and the epi-layer 320, in which the protective layer 360 is formed from oxide or nitride. In some embodiments, the protective layer 360 may be formed from the materials similar to the materials forming the protective layer 160. In certain embodiments, the protective layer 360 may be formed using the processes similar to the processes forming the protective layer 160.

As shown in FIG. 3L, a liner 370 is formed on the protective layer 360. In some embodiments, the liner 370 may be formed from the materials similar to the materials forming the liner 170.

As shown in FIG. 3M, a sputter etching operation 371 is performed to remove a portion of the protective layer 360 and a portion of the liner 370 on the epi-layer 320. In some embodiments, the sputter etching operation 371 is performed using an inert gas such as argon. As shown in FIG.

3M and FIG. 3N, the opening 353 is cleaned using an SPM solution 373 for removing remaining impurities 372 produced from the sputter etching operation 371, in which the SPM solution 373 includes $H_2SO_4$ and $H_2O_2$. In some embodiments, the protective layer 360 formed from oxide or nitride may be used for enhancing an adhesive effect between the sidewall 351 and the liner 370, thereby preventing the metal gate 322B from being etched at the SPM operation, thus preventing the MG missing caused by the SPM operation. In alternative embodiments, the protective layer 360 itself may be also used to protect the metal gate 322B from being etched when the SPM operation is performed, thus preventing the MG missing caused by the SPM operation. Therefore, the IC performance and yield are improved.

As shown in FIG. 3O, a silicide cap 380 is formed on the epi-layer 320. In some embodiments, the silicide cap 380 may be formed from the materials similar to the materials forming the silicide cap 180. In some embodiments, the silicide cap 380 may be formed by forming a metal layer (not shown) conformal to the opening 353 and above the second etch stop layer 350 first. The metal layer is formed from titanium, nickel, cobalt, platinum, palladium, tungsten, tantalum or erbium. In certain embodiments, the metal layer is formed using a CVD process, a PVD process or a HDP process. Then, the metal layer is annealed to form the silicide cap 380 on the epi-layer 320 and a silicide layer (not shown) above the second etch stop layer 350. Thereafter, the silicide layer is removed such as using a chemical mechanical polishing (CMP) process.

As shown in FIG. 3P, a contact plug 390 fills the opening 353. In some embodiments, the contact plug 390 may be formed from the material similar to that forming the contact plug 190.

Figure 4A:
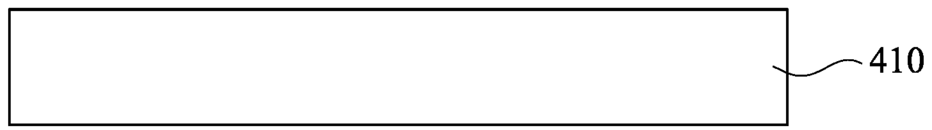
FIG. 4A to FIG. 4J are schematic cross-sectional views of intermediate stages showing a method for fabricating a semiconductor device in accordance with certain embodiments of the present disclosure.

FIG. 4A to 4J are schematic cross-sectional views of intermediate stages showing a method for fabricating a semiconductor device 400 in accordance with certain embodiments of the present disclosure. As shown in FIG. 4A, a substrate 410 is provided. In some embodiments, the substrate 410 may be formed from the materials similar to the materials forming the substrate 110.

Figure 4B:
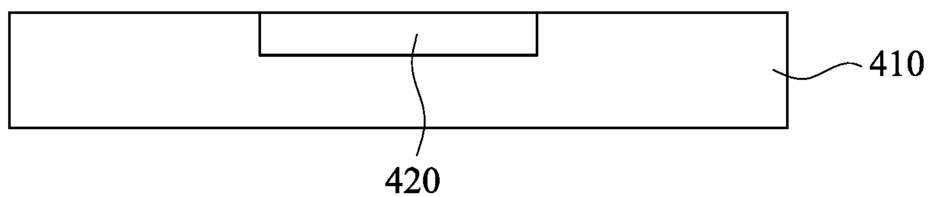

As shown in FIG. 4B, an epi-layer 420 is formed in the substrate 410. In some embodiments, the epi-layer 420 may be formed from the material similar to that forming the epi-layer 120. In certain embodiments, the epi-layer 420 may be formed using the processes similar to those forming the epi-layer 120.

Figure 4C:
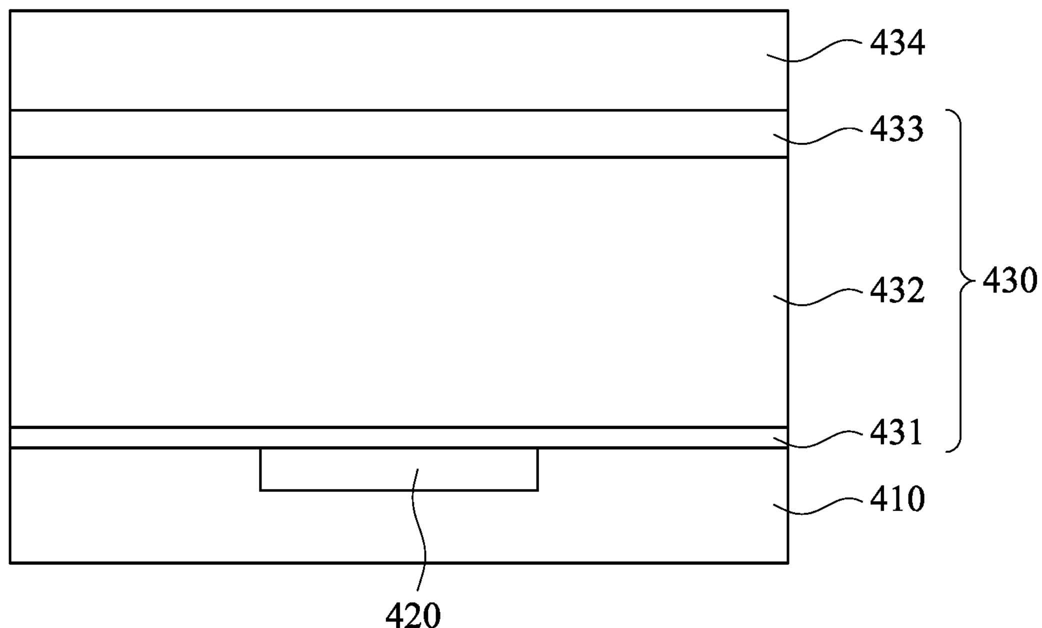

As shown in FIG. 4C, a dielectric layer 430 is formed on the substrate 410. In some embodiments, the dielectric layer 430 is a multi-layer which is formed by depositing a first etch stop layer 431, an ILD layer 432 and a second etch stop layer 433 on the substrate 410 sequentially. In some embodiments, the first etch stop layer 431, the ILD layer 432 and the second etch stop layer 433 may be formed from the materials similar to the materials forming the first etch stop layer 131, the ILD layer 132 and the second etch stop layer 133. In certain embodiments, the first etch stop layer 431, the ILD layer 432 and the second etch stop layer 433 may be formed using the processes similar to the processes forming the first etch stop layer 131, the ILD layer 132 and the second etch stop layer 133. In alternative embodiments, an inter-metal dielectric layer 434 is disposed on the second etch stop layer 433.

Figure 4D:
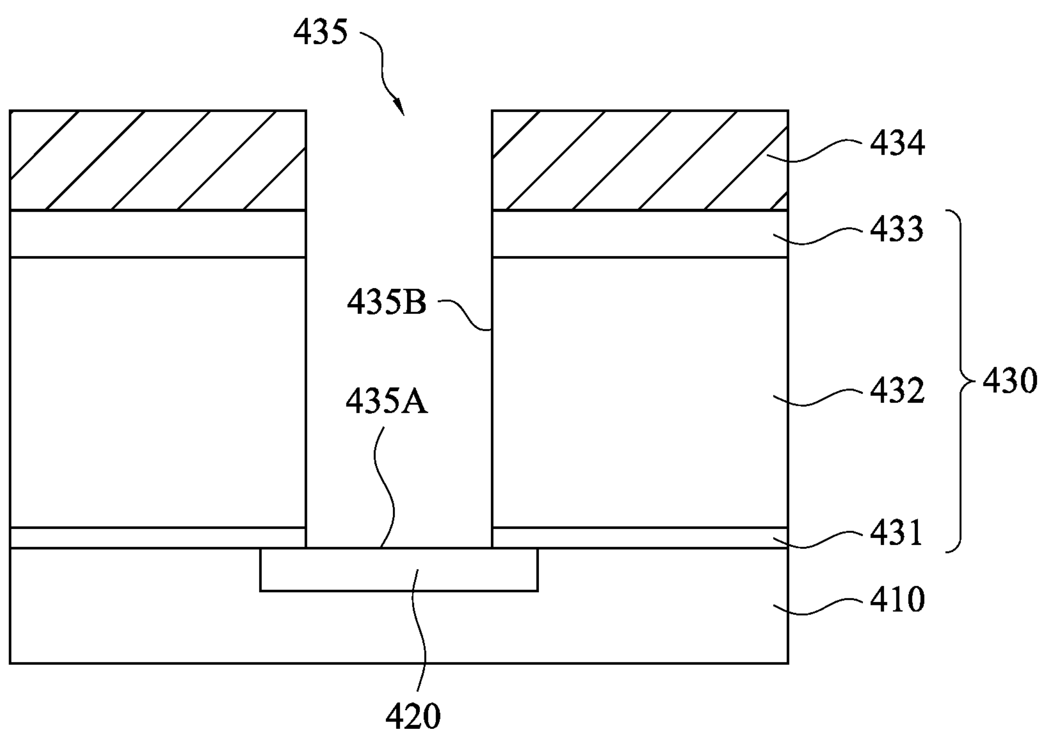

As shown in FIG. 4D, a portion of the dielectric layer 430 is etched to form an opening 435. The opening 435 has a bottom 435A and a sidewall 435B surrounding the bottom 435A. In some embodiments, the portion of the dielectric layer 430 may be etched using a dry etching process or a wet etching process.

Figure 4E:
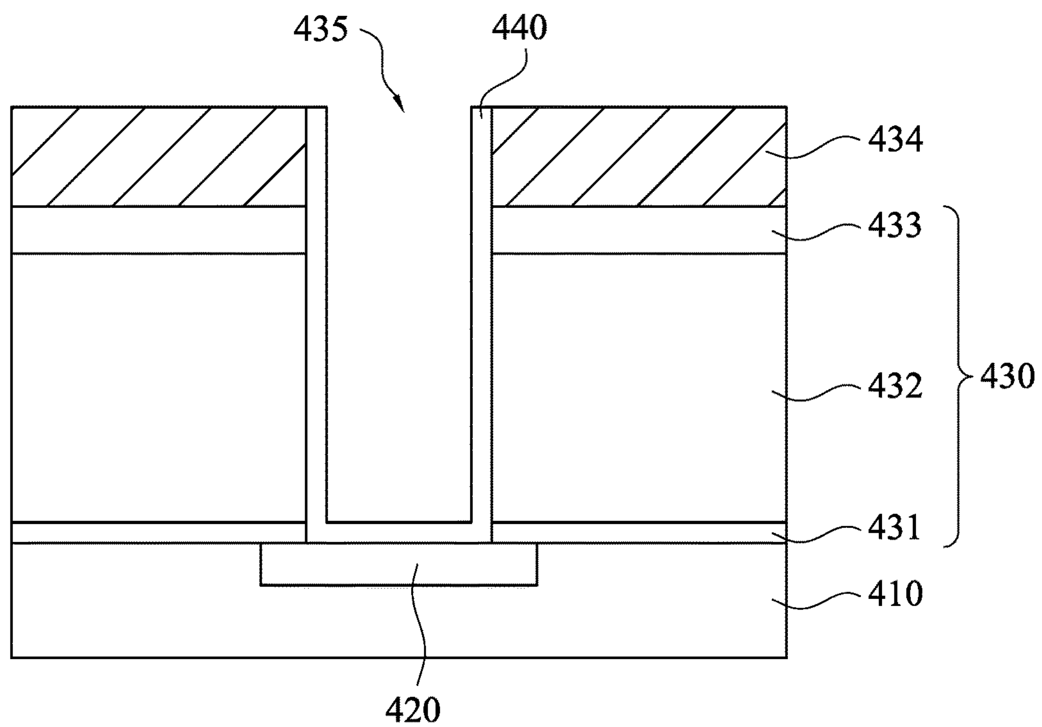

As shown in FIG. 4E, a protective layer 440 is deposited on the sidewall 435B and the bottom 435A, in which the protective layer 440 is formed from oxide or nitride. In some embodiments, the protective layer 440 is deposited using a CVD process, a PVD process or a HDP process.

Figure 4F:
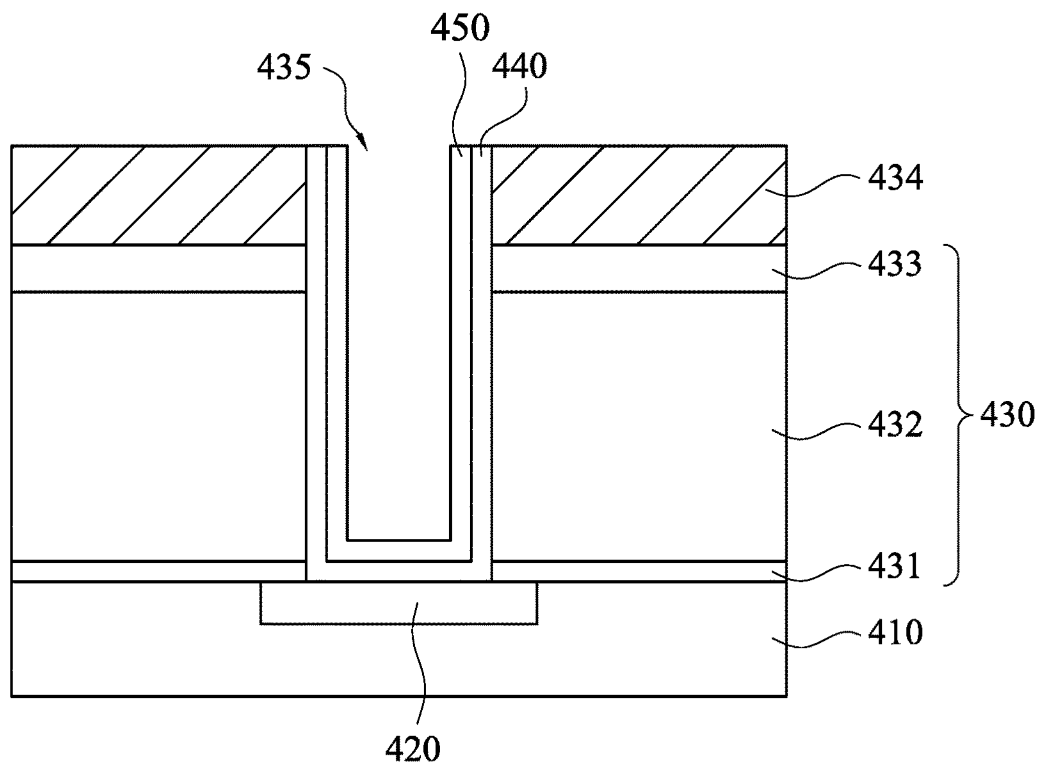

As shown in FIG. 4F, a liner 450 is formed on the protective layer 440. In some embodiments, the liner 450 may be formed from the material similar to that forming the liner 170.

Figure 4G:
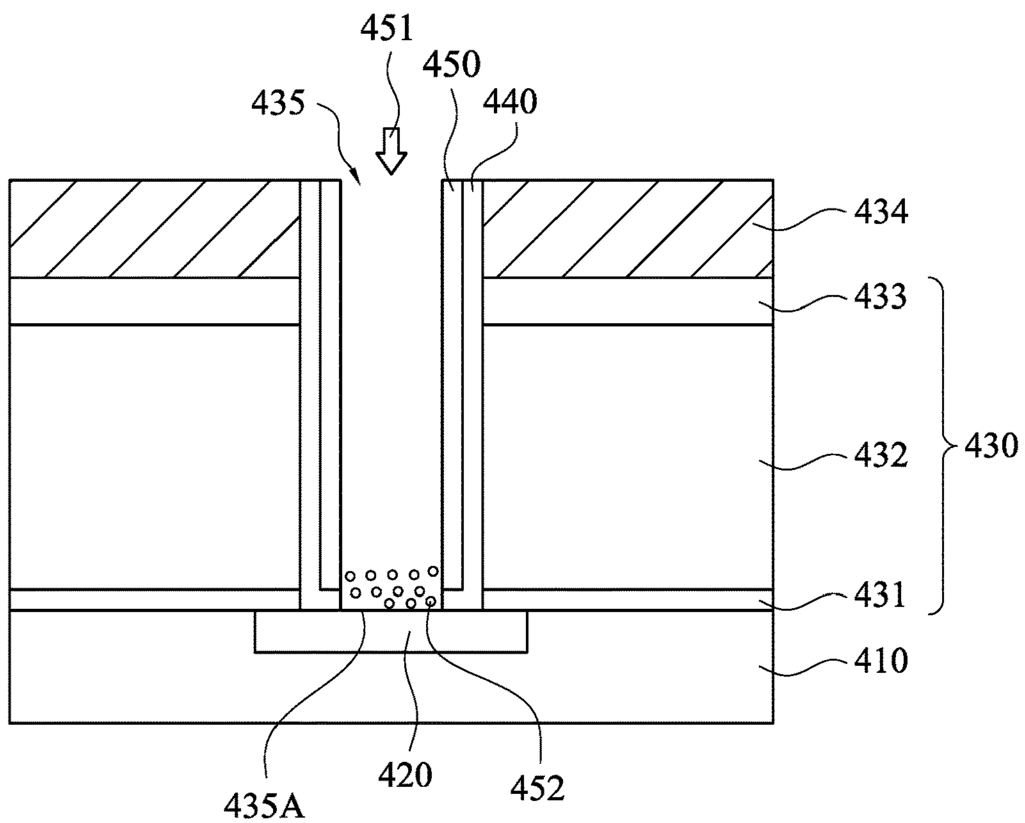
Figure 4H:
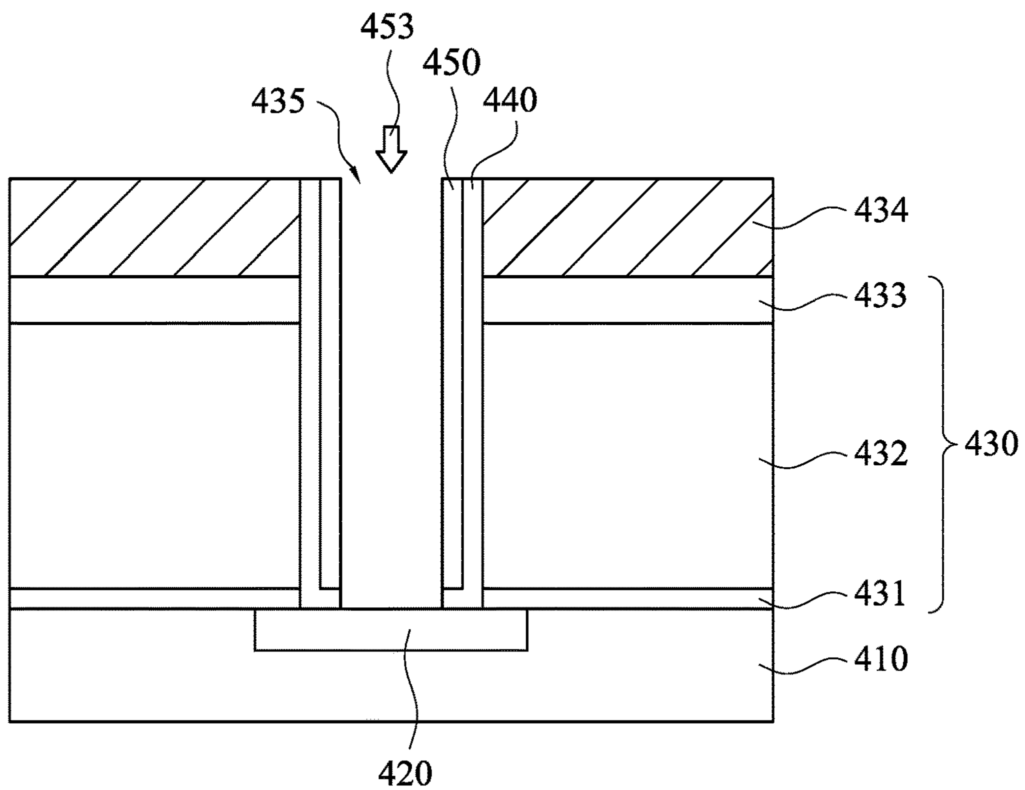

As shown in FIG. 4G, a sputter etching operation 451 is performed to remove the protective layer 440 and the liner 450 on the bottom 435A. In some embodiments, the sputter etching operation 451 is performed using an inert gas such as argon. As shown in FIG. 4G and FIG. 4H, the opening 435 is cleaned using an SPM solution 453 for removing remaining impurities 452 produced from the sputter etching operation 451, in which the SPM solution 453 includes $H_2SO_4$ and $H_2O_2$. In some embodiments, the protective layer 440 formed from oxide or nitride may be used for enhancing an adhesive effect between the sidewall 435B and the liner 450, thereby preventing the dielectric layer 430 from being etched at the SPM operation.

Figure 4I:
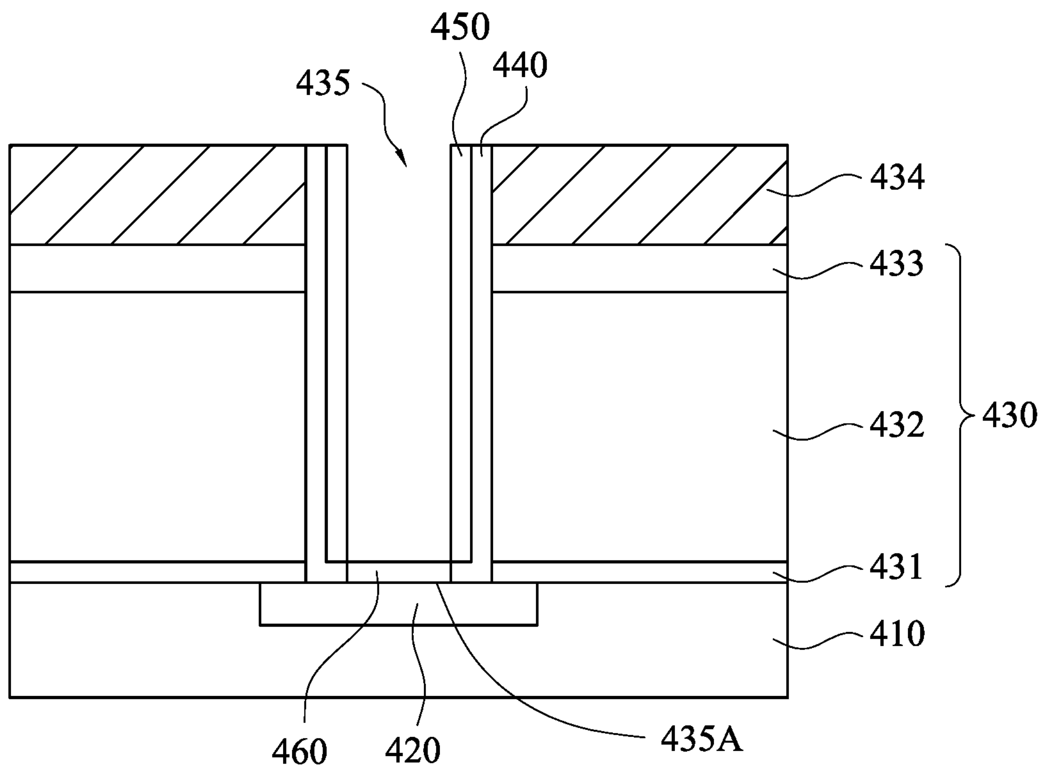

As shown in FIG. 4I, a silicide cap 460 is formed on the bottom 435A. In some embodiments, the silicide cap 460 may be formed from the materials similar to the materials forming the silicide cap 180. In some embodiments, the silicide cap 460 may be formed by forming a metal layer (not shown) conformal to the opening 435 and above the second etch stop layer 433 first. The metal layer is formed from titanium, nickel, cobalt, platinum, palladium, tungsten, tantalum or erbium. In certain embodiments, the metal layer is formed using a CVD process, a PVD process or a HDP process. Then, the metal layer is annealed to form the silicide cap 460 on the bottom 435A and a silicide layer (not shown) above the second etch stop layer 433. Thereafter, the silicide layer is removed such as using a chemical mechanical polishing (CMP) process.

Figure 4J:
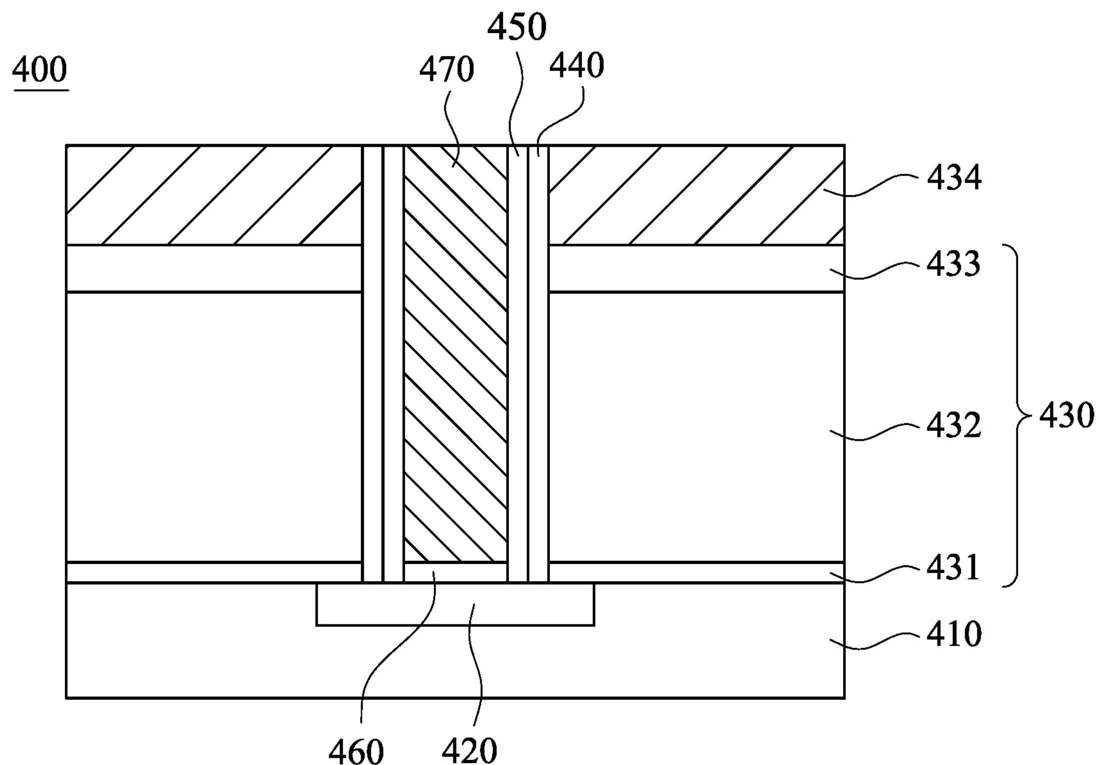

As shown in FIG. 4J, the opening 435 is filled with a contact plug 470. In some embodiments, the contact plug 470 may be formed from the materials similar to the materials forming the contact plug 190.

Figure 5:
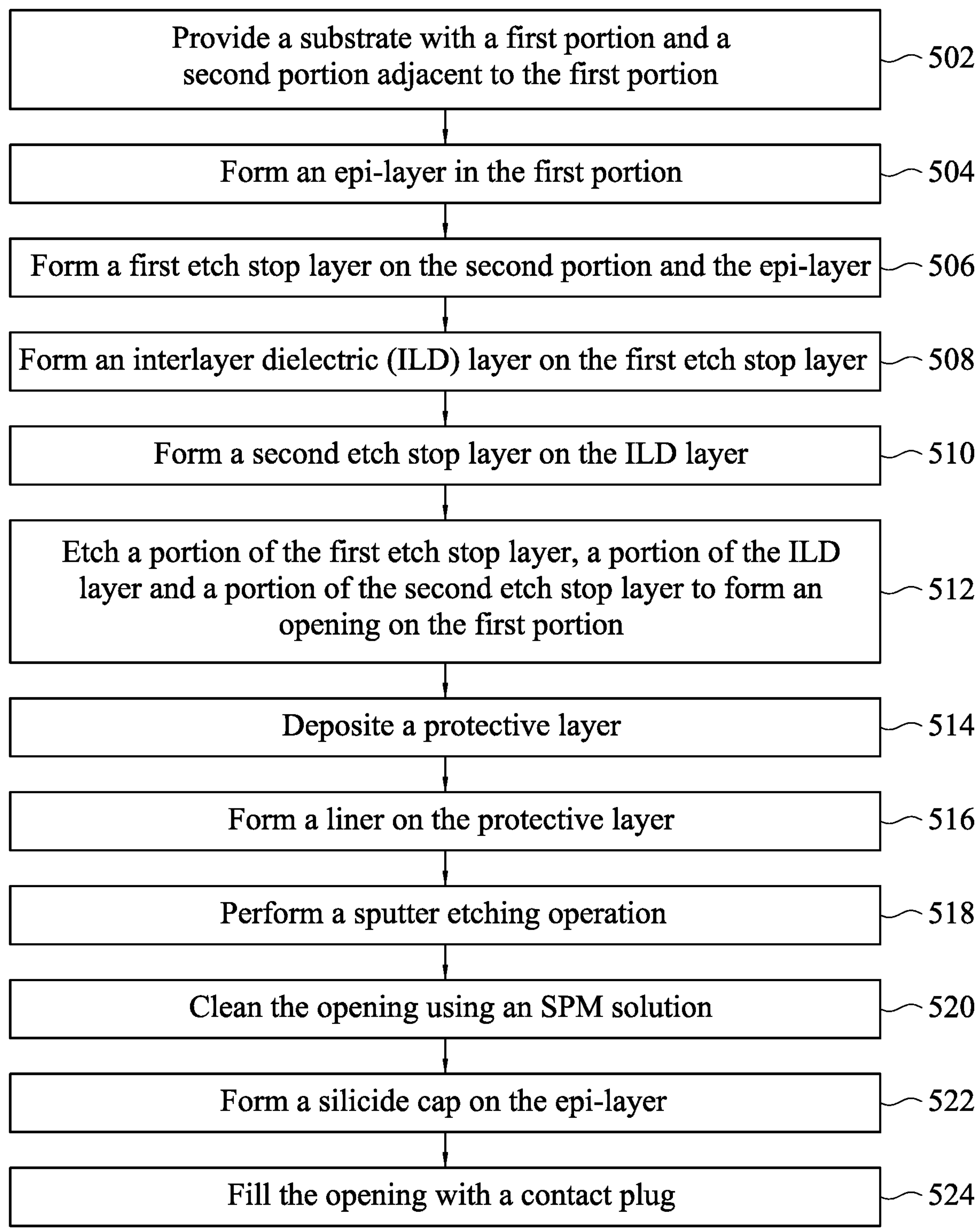
FIG. 5 is a flow chart of a method for fabricating a semiconductor device in accordance with some embodiments of the present disclosure.

Referring to FIG. 5 together with FIG. 3A, FIG. 3B, FIG. 3E, FIG. 3F, FIG. 3H and FIG. 3J to FIG. 3P, FIG. 5 is a flow chart of a method 500 for fabricating a semiconductor device 300 in accordance with some embodiments of the present disclosure. The method 500 begins at operation 502, where a substrate 310 with a first portion 310A and a second portion 310B adjacent to the first portion 310A is provided, as shown in FIG. 3A. At operation 504, an epi-layer 320 is formed in the first portion 310A, as shown in FIG. 3B. At operation 506, a first etch stop layer 330 is formed on the second portion 310B and the epi-layer 320, as shown in FIG. 3E. At operation 508, an interlayer dielectric (ILD) layer 340 is formed on the first etch stop layer 330, as shown in FIG. 3F. At operation 510, a second etch stop layer 350 is formed on the ILD layer 340, as shown in FIG. 3H. At operation 512, a portion of the first etch stop layer 330, a portion of the ILD layer 340 and a portion of the second etch stop layer 350 are etched to form an opening 353 on the first portion 310A, in which the remaining portion of the first etch stop layer 330, the remaining portion of the ILD layer 340 and the portion of the remaining second etch stop layer 350 form a sidewall 351 of the opening 353, as shown in FIG. 3J. At operation 514, a protective layer 360 is deposited on the sidewall 351 and the epi-layer 320, in which the protective layer 360 is formed from oxide or nitride, as shown in FIG. 3K. At operation 516, a liner 370 is formed on the protective layer 360, as shown in FIG. 3L. At operation 518, a sputter etching operation 371 is performed to remove a portion of the protective layer 360 and a portion of the liner 370 on the epi-layer 320, as shown in FIG. 3M. At operation 520, the opening 353 is cleaned using an SPM solution 373, in which the SPM solution 373 includes $H_2SO_4$ and $H_2O_2$, as shown in FIG. 3N. At operation 522, a silicide cap 380 is formed on the epi-layer 320, as shown in FIG. 3O. At operation 524, the opening 353 is filled with a contact plug 390, as shown in FIG. 3P.

Figure 6:
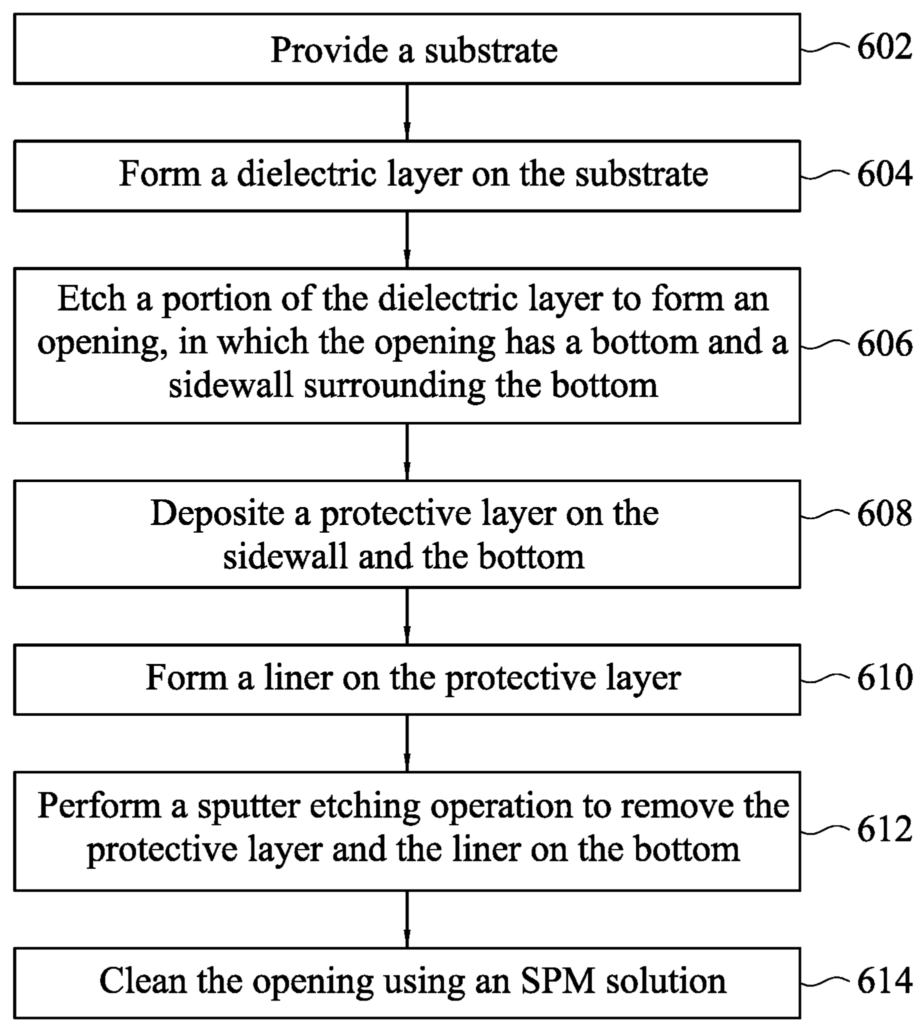
FIG. 6 is a flow chart of a method for fabricating a semiconductor device in accordance with various embodiments of the present disclosure.

Referring to FIG. 6 together with FIG. 4A and FIG. 4C to 4H, FIG. 6 is a flow chart of a method 600 for fabricating a semiconductor device 400 in accordance with various embodiments of the present disclosure. The method 600 begins at operation 602, where a substrate 410 is provided, as shown in FIG. 4A. At operation 604, a dielectric layer 430 is formed on the substrate 410, as shown in FIG. 4C. At operation 606, a portion of the dielectric layer 430 is etched to form an opening 435, in which the opening 435 has a bottom 435A and a sidewall 435B surrounding the bottom 435A, as shown in FIG. 4D. At operation 608, a protective layer 440 is deposited on the sidewall 435B and the bottom 435A, in which the protective layer 440 is formed from oxide or nitride, as shown in FIG. 4E. At operation 610, a liner 450 is formed on the protective layer 440, as shown in FIG. 4F. At operation 610, a sputter etching operation 451 is performed to remove the protective layer 440 and the liner 450 on the bottom 435A, as shown in FIG. 4G. At operation 612, the opening 435 is cleaned using an SPM solution 453, in which the SPM solution 453 includes $H_2SO_4$ and $H_2O_2$, as shown in FIG. 4H.

In accordance with some embodiments, the present disclosure discloses a semiconductor device. The semiconductor device includes a substrate, an epi-layer, a first etch stop layer, an interlayer dielectric (ILD) layer, a second etch stop layer, a protective layer, a liner, a silicide cap and a contact plug. The substrate has a first portion and a second portion adjacent to the first portion. The epi-layer is disposed in the first portion. The first etch stop layer is disposed on the second portion. The interlayer dielectric (ILD) layer is disposed on the first etch stop layer. The second etch stop layer is disposed on the ILD layer, in which the first etch stop layer, the ILD layer and the second etch stop layer form a sidewall surrounding the first portion. The protective layer is disposed on the sidewall, in which the protective layer is formed from oxide or nitride. The liner is disposed on the protective layer. The silicide cap is disposed on the epi-layer. The contact plug is disposed on the silicide cap and surrounded by the liner.

In accordance with certain embodiments, the present disclosure discloses a method for forming a semiconductor device. In this method, a substrate with a first portion and a second portion adjacent to the first portion is provided. An epi-layer is formed in the first portion. A first etch stop layer is formed on the second portion and the epi-layer. An interlayer dielectric (ILD) layer is formed on the first etch stop layer. A second etch stop layer is formed on the ILD layer. A portion of the first etch stop layer, a portion of the ILD layer and a portion of the second etch stop layer are etched to form an opening on the first portion, in which the remaining portion of the first etch stop layer, the remaining portion of the ILD layer and the remaining portion of the second etch stop layer form a sidewall of the opening. A protective layer is deposited on the sidewall and the epi-layer, in which the protective layer is formed from oxide or nitride. A liner is formed on the protective layer. A sputter etching operation is performed to remove a portion of the protective layer and a portion of the liner on the epi-layer. The opening is cleaned using an SPM solution, in which the SPM solution includes $H_2SO_4$ and $H_2O_2$. A silicide cap is formed on the epi-layer. The opening is filled with a contact plug.

In accordance with alternative embodiments, the present disclosure discloses a method for fabricating a semiconductor device. In this method, a substrate is provided. A dielectric layer is formed on the substrate. A portion of the dielectric layer is etched to form an opening, in which the opening has a bottom and a sidewall surrounding the bottom. A protective layer is deposited on the sidewall and the bottom, in which the protective layer is formed from oxide or nitride. A liner is formed on the protective layer. A sputter etching operation is performed to remove the protective layer and the liner on the bottom. The opening is cleaned using an SPM solution, in which the SPM solution includes $H_2SO_4$ and $H_2O_2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a source/drain feature in a semiconductive substrate;

depositing an interlayer dielectric (ILD) layer over the source/drain feature;

etching the ILD layer to form an opening;

depositing a protective layer over sidewalls and a bottom of the opening;

depositing a liner over the protective layer, wherein the liner and the protective layer have a distinguishable interface;

etching the liner and the protective layer to expose a portion of the source/drain feature;

forming a silicide cap over the exposed portion of the source/drain feature such that a sidewall of the silicide cap is in contact with the etched liner and the etched protective layer; and filling the opening with a conductor.

2. The method of claim 1, wherein the protective layer comprises a nitride, and depositing the protective layer is performed such that the protective layer is in contact with the source/drain feature.

3. The method of claim 2, wherein etching the liner and the protective layer is performed such that a portion of the etched protective layer is sandwiched between a bottom of the etched liner and the source/drain feature.

4. The method of claim 1, wherein the liner comprises silicon oxy-nitride, silicon carbide or silicon oxy-carbide.

5. The method of claim 1, wherein the protective layer comprises a nitride, and depositing the protective layer is performed such that the protective layer is in contact with the ILD layer.

6. The method of claim 1, further comprising:

depositing a etch stop layer over the ILD layer prior to etching the ILD layer to form the opening; and etching the etch stop layer prior to etching the ILD layer to form the opening.

7. The method of claim 1, wherein forming the silicide cap over the exposed portion of the source/drain feature is performed prior to filling the opening with the conductor.

8. The method of claim 7, further comprising:

cleaning the exposed portion of the source/drain feature prior to forming the silicide cap over the exposed portion of the source/drain feature.

9. A method, comprising:

depositing an interlayer dielectric (ILD) layer over a semiconductive substrate;

etching the ILD layer to form an opening;

depositing a protective layer over sidewalls and a bottom of the opening, wherein the protective layer comprises a nitride;

depositing a liner over the protective layer, wherein the liner comprises silicon oxy-nitride, silicon carbide or silicon oxy-carbide;

etching the liner and the protective layer over the bottom of the opening such that a portion of the etched protective layer is in contact with a bottom surface of the etched liner; and after etching the liner and the protective layer, filling the opening with a conductor, wherein a bottom of the conductor is higher than a bottom of the portion of the etched protective layer.

10. The method of claim 9, wherein depositing the protective layer is performed such that the protective layer is in contact with the ILD layer.

11. The method of claim 9, further comprising:

cleaning the opening prior to filling the opening with the conductor.

12. The method of claim 11, wherein cleaning the opening is performed using a sulfuric acid-hydrogen peroxide mixture (SPM) solution.

13. The method of claim 9, wherein filling the opening with the conductor is performed such that the bottom of the conductor is higher than a bottom of the etched liner.

14. A method, comprising:

forming a source/drain feature in a semiconductive substrate;

depositing an interlayer dielectric (ILD) layer over the source/drain feature;

etching the ILD layer to form an opening;

depositing a protective layer over sidewalls and a bottom of the opening;

depositing a liner over the protective layer;

etching the liner and the protective layer to expose a portion of the source/drain feature; and filling the opening with a conductor, wherein a bottom of the conductor is higher than a bottom of the etched liner.

15. The method of claim 14, further comprising:

forming a silicide cap over the exposed portion of the source/drain feature after etching the liner and the protective layer.

16. The method of claim 15, wherein forming the silicide cap is performed such that a top of the silicide cap is higher than a bottom of the etched liner.

17. The method of claim 15, wherein forming the silicide cap is performed such that the silicide cap is in contact with a sidewall of the etched liner.

18. The method of claim 14, wherein the protective layer and the liner are made of different materials.

19. The method of claim 14, wherein the liner comprises silicon oxy-nitride, silicon carbide or silicon oxy-carbide.

20. The method of claim 14, wherein depositing the liner over the protective layer is such that the liner is spaced apart from the source/drain feature.

* * * * *